(12) United States Patent
Nobori

(10) Patent No.: US 9,306,095 B2
(45) Date of Patent: Apr. 5, 2016

(54) SOLAR CELL AND METHOD FOR MANUFACTURING SAME

(71) Applicant: Panasonic Intellectual Property Management Co., Ltd., Osaka (JP)

(72) Inventor: Kazuhiro Nobori, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 57 days.

(21) Appl. No.: 14/359,582

(22) PCT Filed: Oct. 19, 2012

(86) PCT No.: PCT/JP2012/006696
§ 371 (c)(1),
(2) Date: May 21, 2014

(87) PCT Pub. No.: WO2013/088621
PCT Pub. Date: Jun. 20, 2013

(65) Prior Publication Data
US 2014/0338726 A1 Nov. 20, 2014

(30) Foreign Application Priority Data
Dec. 14, 2011 (JP) ................................. 2011-273742

(51) Int. Cl.
*H01L 31/044* (2014.01)
*H01L 31/024* (2014.01)
(Continued)

(52) U.S. Cl.
CPC ........ *H01L 31/024* (2013.01); *H01L 31/02327* (2013.01); *H01L 31/048* (2013.01); *H01L 31/052* (2013.01); *H01L 31/0687* (2013.01);
(Continued)

(58) Field of Classification Search
CPC ........ H01L 31/00–31/078; Y02E 10/50–10/60
USPC .................................................. 136/243–265
See application file for complete search history.

(56) References Cited

U.S. PATENT DOCUMENTS

| 4,638,110 A | 1/1987 | Erbert |
| 6,057,505 A | 5/2000 | Ortabasi |

(Continued)

FOREIGN PATENT DOCUMENTS

| EP | 2405485 | 2/2010 |
| EP | 2375455 | 4/2010 |

(Continued)

OTHER PUBLICATIONS

The Extended European Search Report dated Dec. 4, 2014 for the corresponding European Patent Application No. 12856610.6.

(Continued)

*Primary Examiner* — Bach Dinh
(74) *Attorney, Agent, or Firm* — Wenderoth, Lind & Ponack, L.L.P.

(57) ABSTRACT

A solar cell includes: a substrate having heat dissipating characteristics; a solar cell bonded to the substrate such that the solar cell is electrically connected on a first conductive line and a second conductive line, which are disposed on a surface of the substrate; a lens, which is bonded to a transparent electrode of the solar cell; a plurality of projections, which maintain a gap between the substrate and the lens; tapered hole sections in the substrate, each of said tapered hole sections having a tapered section of each of the protruding sections fitted therein; and a sealing resin applied to the gap.

7 Claims, 14 Drawing Sheets

(51) Int. Cl.
  H01L 31/052    (2014.01)
  H01L 31/0725   (2012.01)
  H01L 31/0232   (2014.01)
  H01L 31/0687   (2012.01)
  H01L 31/0693   (2012.01)
  H01L 31/048    (2014.01)
  H01L 31/18     (2006.01)

(52) U.S. Cl.
  CPC ........ *H01L 31/0693* (2013.01); *H01L 31/0725* (2013.01); *H01L 31/1892* (2013.01); *Y02E 10/52* (2013.01); *Y02E 10/548* (2013.01)

(56) References Cited

U.S. PATENT DOCUMENTS

| | | | |
|---|---|---|---|
| 2002/0144725 A1* | 10/2002 | Jordan | H01L 31/02167 136/247 |
| 2005/0115602 A1* | 6/2005 | Senta | H01L 31/035281 136/250 |
| 2006/0083459 A1 | 4/2006 | Minamio et al. | |
| 2006/0231133 A1 | 10/2006 | Fork et al. | |
| 2007/0256726 A1 | 11/2007 | Fork et al. | |
| 2009/0183762 A1 | 7/2009 | Jackson et al. | |
| 2010/0236601 A1 | 9/2010 | Okamoto | |
| 2010/0236603 A1 | 9/2010 | Menard et al. | |
| 2011/0197951 A1 | 8/2011 | Abiko et al. | |
| 2011/0204647 A1 | 8/2011 | Numajiri | |
| 2011/0286120 A1 | 11/2011 | Harris | |
| 2012/0074463 A1* | 3/2012 | Hata | H01L 27/142 257/184 |
| 2012/0291850 A1 | 11/2012 | Juso | |

FOREIGN PATENT DOCUMENTS

| | | |
|---|---|---|
| JP | 56-169373 | 12/1981 |
| JP | 63-31554 U | 3/1988 |
| JP | 09-083006 | 3/1997 |
| JP | 10-150213 | 6/1998 |
| JP | 2004-221119 | 8/2004 |
| JP | 2006-303494 | 11/2006 |
| JP | 2009-177082 | 8/2009 |
| JP | 2010-050341 | 3/2010 |
| JP | 2011-108866 | 6/2011 |
| JP | 2011-124474 | 6/2011 |
| JP | 2011-142118 | 7/2011 |
| WO | 2010/101030 | 9/2010 |
| WO | 2010/140371 | 12/2010 |
| WO | 2011/081090 | 7/2011 |

OTHER PUBLICATIONS

International Search Report of PCT Application No. PCT/JP2012/006696 dated Jan. 15, 2013.
J. Vac. Sci. Technol. B, vol. 11, No. 1, Jan./Feb. 1993.
English Abstract of the Institute of Electronics, Information and Communication Engineers, IEICE Technical Report, ED2007-217, MW2007-148 (Jan. 2008).
European Office Action issued Sep. 29, 2015 in European Patent Application No. 12 856 610.6.

* cited by examiner

PRIOR ART

PRIOR ART

PRIOR ART

PRIOR ART

SOLAR CELL AND METHOD FOR MANUFACTURING SAME

TECHNICAL FIELD

The present invention relates to a solar cell battery and a method for manufacturing the same.

BACKGROUND ART

Among different types of solar cells, the multijunction solar cell is the most efficient solar cell and is therefore suitable for concentrator solar cell batteries. Several solar cell batteries having the III-V multijunction solar cells have been known (e.g., see PTLs 1 and 2). FIGS. 11 to 14 illustrate schematic views of cross-sectional structure of conventional solar cell batteries having the III-V multijunction solar cells.

FIG. 11 is a first example of a conventional solar cell battery (see PTL 1). Solar cell battery 100 illustrated in FIG. 11 includes optical component 110 for concentrating sunlight and back sheet 140. Optical component 110 is formed from a Cassegrain glass lens. In a part of the glass lens, recess 113 for placing therein solar cell 120 is formed.

Back sheet 140 is bonded to optical component 110. Back sheet 140 includes circuit board 150 and adhesive layer 155. Circuit board 150 includes insulator 153 and conductor 154. Solar cell 120 is electrically and physically connected to electrode part 154A and 154B of conductor 154 by first connecting part 124A and second connecting part 124B, respectively.

FIG. 12 is a second example of a conventional solar cell battery (see PTL 2). Solar cell battery 200 illustrated in FIG. 12 includes an optical component for concentrating sunlight and primary mirror 230 integrally formed with the optical component. The optical component is formed from a Cassegrain glass lens.

Primary mirror 230 includes two metal films 231 and 234 arranged with gap 237 in between. Primary mirror 230 has a bowl shape. The flat part at the bottom of primary mirror 230 has opening 239. Opening 239 is a path for concentrated sunlight. Solar cell 220 for receiving sunlight passed through opening 239 is fixed outside of the bottom of primary mirror 230. Solar cell 220 includes electrodes on both sides, one of which is connected to an interconnection line by die-bonding and the other is connected to an interconnection line by wire bonding.

FIG. 13 illustrates solid light-transparent optical panel 300 which is an array of solar cell batteries 200 illustrated in FIG. 12. Optical component 210 in solar cell battery 200 is hexagonal. Optical components 210 are disposed next to one another to constitute one panel.

FIG. 14 illustrates concentrator solar collecting unit 400C which is an array of solar cell batteries 200 illustrated in FIG. 12. In concentrator solar collecting unit 400C, the above-described two metal films 231 and 234 of solar cell battery 200 constitute two electrodes, i.e., the P-side electrode and N-side electrode, respectively. The P-side electrode on one of two adjacent solar cell batteries 200 and the N-side electrode on the other of the two adjacent solar cell batteries 200 are electrically connected. Concentrator solar collecting unit 400C is composed by connecting pairs of solar cell batteries 200 in series. Power generated at concentrator solar collecting unit 400C is extracted to outside by socket connector 420. Other related techniques are also presented (for example, see PTLs 3 to 6). For example, PTLs 3 to 5 disclose a solar cell battery in which sunlight concentrated by a lens enters a multijunction solar cell device fixed to a substrate having heat dissipation property. PTL6 discloses a solar cell in which a first electrode in square U shape having one end attached to the surface of the P-type semiconductor is provided on an insulating film covering the side surface of the N-type semiconductor and the end of the back surface and is connected to the bus bar on the front surface. The inventions according to PTLs 3 to 6 have concerns in heat dissipation property and others.

CITATION LIST

Patent Literature

PTL1
US Patent Application Publication No. 2007/0256726
PTL2
Japanese Patent Application Laid-Open No. 2006-303494
PTL3
Japanese Patent Application Laid-Open No. 2009-177082
PTL4
US Patent Application Publication No. 2010/0236601
PTL5
US Patent Application Publication No. 2010/0236603
PTL6
Japanese Unexamined Utility Model (Registration) Application Publication No. S63-31554

SUMMARY OF INVENTION

Technical Problem

The conventional solar cell battery includes a concentrating lens and a metal film used as a reflecting mirror and a line part provided facing the concentrating lens. Accordingly, the thin metal film serves as a heat dissipation path from a solar cell generating heat due to concentrated sunlight. Accordingly, the heat dissipation property of the solar cell battery is low. For this reason, a heat sink for heat dissipation has been attached to the solar cell battery where appropriate in order to improve the heat dissipation property. However, problems to be solved in terms of heat dissipation property remain, and there is a request for a solar cell battery having good heat dissipation property.

The conventional solar cell battery has a bifacial electrode structure in which the solar cell includes a surface electrode and a back surface electrode. Accordingly, mounting of the back surface electrode is performed by die bonding in view of the productivity, for example, and mounting of the surface electrode is performed in a process different from the mounting of the back surface electrode, such as wire bonding in terms of securing an incident surface, for example. Stated differently, for the manufacture of the conventional solar cell battery, two mounting steps are required, i.e., the step of mounting the back surface electrode and the step of mounting the surface electrode, in order to electrically connect the solar cell to the outside. Therefore, a production lead time is increased.

The solar cell having the bifacial electrode structure may be configured as a surface mounted package in which the electrodes are disposed on one side. However, in this case, the step of packaging a bifacial electrode structure solar cell into a single-sided electrode package is necessary, resulting in increased production lead time and low heat dissipation property. Accordingly, a solar cell battery having a shorter production lead time has been sought.

It is an object of the present invention to provide a solar cell battery that exhibits high heat dissipation property with a shorter production lead time.

Solution to Problem

The present invention provides the following solar cell batteries as a solution to the problems described above.

[1] A solar cell battery including:

a substrate including a tabular base having heat dissipation property, a first conductive line and a second conductive line, the first conductive line and the second conductive line provided on the base;

a multijunction solar cell including a first electrode electrically connected to the first conductive line; a bottom cell layer provided on the first electrode; a top cell layer provided on the bottom cell layer; a transparent electrode provided on the top cell layer;

an insulating layer provided on a side surface of a cell laminate including the bottom cell layer and the top cell layer; and a second electrode provided on a side surface of the cell laminate through the insulating layer, the second electrode being electrically connected to the transparent electrode and the second conductive line; and a lens provided in close contact with the transparent electrode, the lens having a focal point at the transparent electrode.

[2] The solar cell battery according to [1], wherein the lens further includes:

a pillar projecting from a surface of the lens opposite to a light incident surface of the lens; and a tapered part provided at a tip of the pillar, wherein the substrate further includes a tapered hole into which the tapered part is fitted.

[3] The solar cell battery according to [1], further including a spacer for supporting the lens over the substrate.

[4] The solar cell battery according to [1], further including an anisotropic conductive film provided between the first electrode and the first conductive line, and between the second electrode and the second conductive line.

[5] The solar cell battery according to [1], wherein the multijunction solar cell includes a plurality of multijunction solar cells provided on a single board of the substrate, and the lens is a compound eye lens having a focal point at each transparent electrode included in the transparent electrode, the each transparent electrode being in close contact with the lens.

[6] The solar cell battery according to [1], wherein a lower surface of the second electrode is positioned below a lower surface of the third electrode.

[7] The solar cell battery according to [1], further including a central electrode on a side of a lower surface of the third electrode, wherein a lower surface of the second electrode and a lower surface of the central electrode are provided in the same plane.

In addition, the present invention provides the following methods for manufacturing a solar cell battery as a solution to the problems described above.

[8] A method for manufacturing a solar cell battery including:

providing a lens having a focal point on a surface opposite to a light incident surface;

providing a multijunction solar cell including: a first electrode; a bottom cell layer provided on the first electrode; a top cell layer provided on the bottom cell layer; a transparent electrode provided on the top cell layer; an insulating layer provided on a side surface of a cell laminate including the bottom cell layer and the top cell layer; and a second electrode electrically connected to the transparent electrode and provided on a side surface of the cell laminate through the insulating layer;

providing a substrate including a tabular base having heat dissipation property, a first conductive line and a second conductive line, the first conductive line and the second conductive line provided on the base;

bonding the lens and the multijunction solar cell such that the transparent electrode is placed at the focal point of the lens; and bonding the multijunction solar cell and the substrate such that the first electrode of the multijunction solar cell bonded to the lens is electrically connected to the first conductive line and the second electrode is electrically connected to the second conductive line.

[9] The method for manufacturing the solar cell battery according to [8], further including supporting the lens over the substrate by a spacer, the lens to which the multijunction solar cell is bonded.

[10] The method for manufacturing the solar cell battery according to [8], wherein the lens includes: a pillar projecting from a surface opposite to a light incident surface; and a tapered part provided at a tip of the pillar, and the substrate further includes a tapered hole into which the tapered part is fitted, at a position on which the multijunction solar cell is to be provided on the substrate, the method further including determining a bonding position for the multijunction solar cell with respect to the substrate by fitting the tapered part into the tapered hole.

[11] The method for manufacturing the solar cell battery according to [8], wherein an anisotropic conductive film is provided between the multijunction solar cell and the substrate.

[12] The method for manufacturing the solar cell battery according to [8], wherein the lens is a compound eye lens having a plurality of focal points on a surface opposite to a light incident surface, the substrate has the first conductive line and the second conductive line at positions corresponding to each of the focal points, and the multijunction solar cell is bonded to each of the focal points of the compound eye lens and each of the multijunction solar cells bonded to the compound eye lens is bonded to the substrate.

Advantageous Effects of Invention

The solar cell battery according to the present invention includes a second electrode and a base. The heat on the incident surface side of the solar cell (for example, lens) is transmitted to the base via the second electrode. Since the base has a heat dissipation property, the transmitted heat is rapidly released to outside. Accordingly, the solar cell battery according to the present invention has excellent heat dissipation property.

The solar cell battery according to the present invention includes the second electrode. Accordingly, in the solar cell, a conductive path of the transparent electrode on the incident surface of sunlight runs as far as to a side opposite to the incident surface of sunlight. This eliminates the step of guiding the electrodes on both sides of the cell laminate to one side of the cell laminate (one-side electrode packaging step). Therefore, compared to the conventional solar cell battery, the production lead time can be reduced at least for the time necessary for the one-side electrode packaging step.

DESCRIPTION OF EMBODIMENTS

Figure 1:
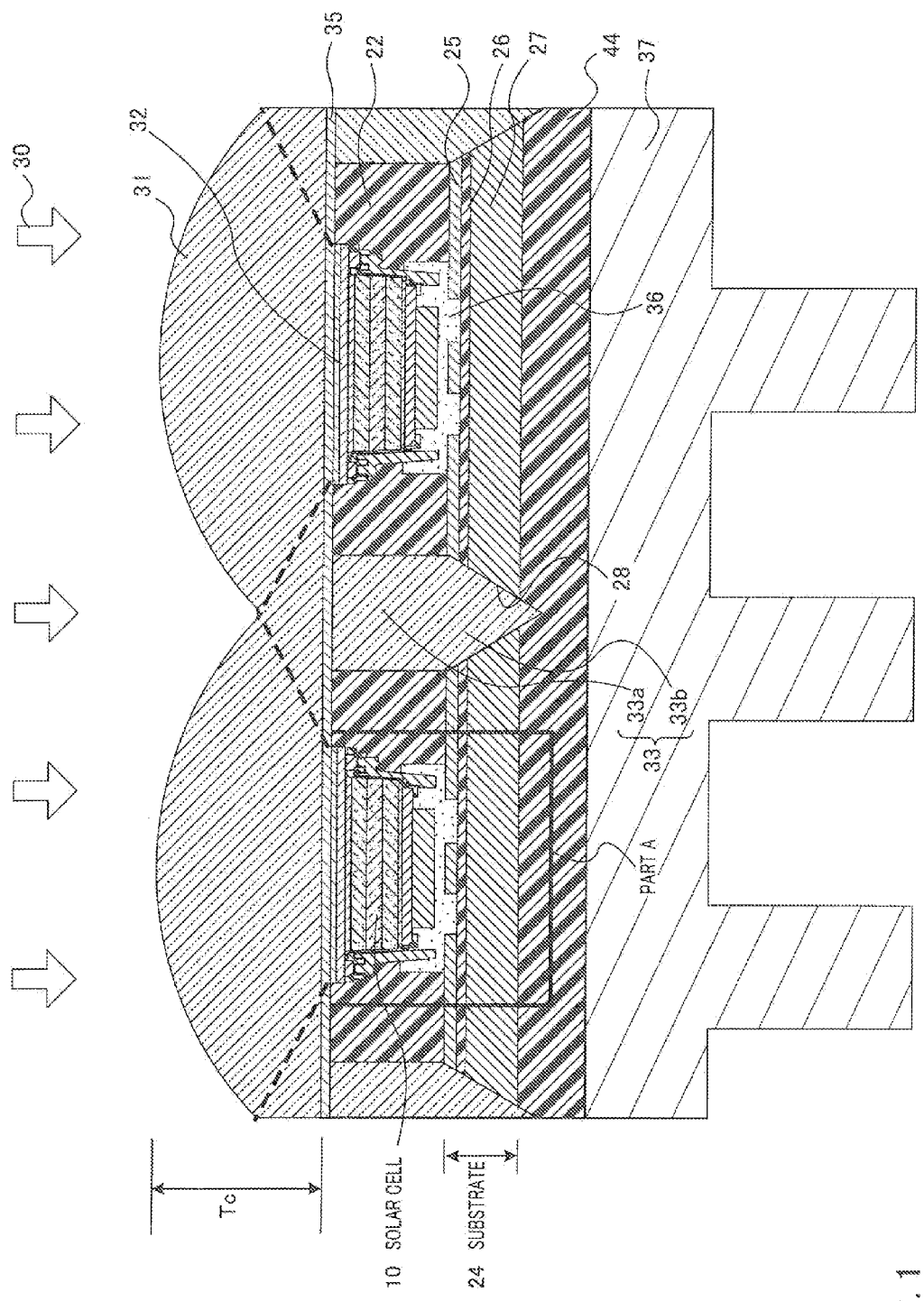
FIG. 1 schematically illustrates a configuration of a solar cell battery according to an exemplary embodiment.

The solar cell battery according to an exemplary embodiment of the present invention will be described below with reference to the accompanying drawings. In the drawings, the same reference numerals are assigned to substantially same components, and description for these components will be omitted.

Solar Cell Battery

As illustrated in FIG. 1, the solar cell battery according to the embodiment includes substrate 24 having heat dissipation property, a plurality of multijunction solar cells 10 placed on substrate 24, and lens 31 disposed over the plurality of solar cells 10 for concentrating light on each of the plurality of solar cells 10. ACF 36 which is an anisotropic conductive film for electrically connecting solar cell 10 and substrate 24 is provided between each of solar cells 10 and substrate 24.

Substrate

As illustrated in FIG. 1, substrate 24 further includes a plurality of tapered holes 28. Tapered hole 28 has a shape in which an opening area gradually decreases from the upper surface toward the lower surface of substrate 24. Tapered hole 28 is contoured to the shape and size of the tapered part of the projection of the lens to be described later. The diameter of tapered hole 28 is 20 to 50 µm, for example, and the tapered angle of tapered hole 28 is 30 to 60°, for example. Tapered holes 28 are provided at regular interval (e.g., at an interval from 10 to 150 mm), for example at the four corners of a square area of substrate 24 in which one solar cell 10 is provided.

Figure 2:
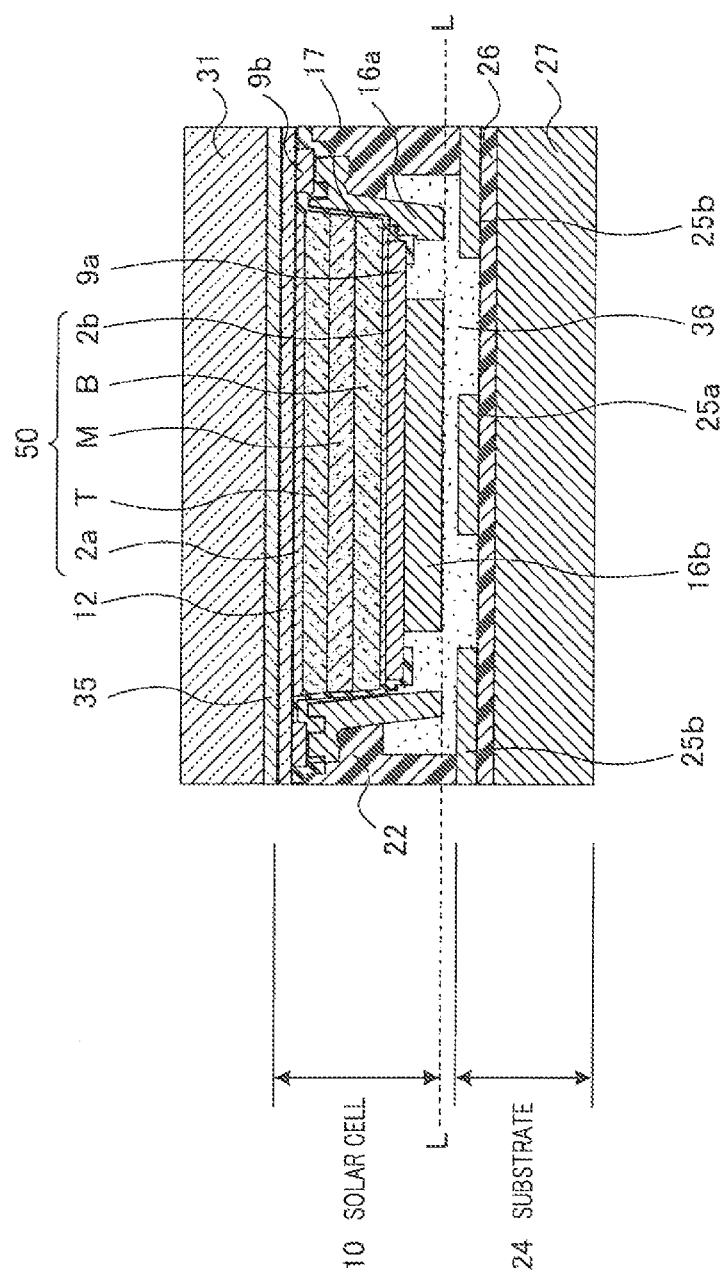
FIG. 2 is an enlarged view schematically illustrating a configuration of a solar cell battery according to the embodiment.

FIG. 2 is an enlarged view of part A in FIG. 1. As illustrated in FIG. 2, substrate 24 includes tabular base 27 having heat heat dissipation property, first conductive line 25a and second conductive line 25b provided on base 27. Heat dissipation property represents a degree of ease of heat transfer from base 27. The heat dissipation property of base 27 is represented by thermal conductivity, for example. The thermal conductivity of base 27 is preferably 1.0 W/(m·K) or more, and more preferably 2.0 W/(m·K) or more, in order to effectively dissipate heat at the lens. As base 27, a metal plate or a ceramic plate having the heat dissipation property described above may be used, for example. More specifically, an aluminum based substrate or an iron based substrate may be used as base 27. It is preferable that the thermal conductivity of base 27 is 2 to 8 W/(m·K), for example. In addition, base 27 preferably has the thickness from 1.0 to 1.5 mm, for example.

First conductive line 25a and second conductive line 25b are electrically independent of each other. The first conductive line and second conductive line may be formed by a common method for forming on a base a conductive layer such as a metal layer into a desired shape. In terms of tolerance to voltage, the thickness of the first conductive line and the second conductive line is preferably 18 to 36 µm.

First conductive line 25a is provided at a part electrically connected to central electrode 16b in solar cell 10 described later. Second conductive line 25b is provided at a part electrically connected to second electrode 16a in solar cell 10 described later. First conductive line 25a and second conductive line 25b are composed of a copper layer having a predetermined planar shape, and an Ni—Au layer formed thereon by plating Ni and Au. The copper layer has the thickness of 10 to 50 µm, for example. The Ni—Au layer is formed by flash Au plating or electro Au plating. The thickness of Ni—Au layer is, for example, 0.5 µm at the maximum.

When base 27 is conductive, substrate 24 may further include insulating layer 26 (hereafter also referred to as "first insulating layer") on the surface of base 27. First insulating layer 26 may be formed on the entire surface of the base in order to facilitate layer formation, or may be formed around the first conductive line and the second conductive line in order to improve the heat dissipation property. The first insulating layer may be formed by a common method for forming a desired planar layer on a plate-shaped member. As the material for the first insulating layer, epoxy resins, phenol resins, fluorine resins, polyimide resins, silicone resins, and acrylic resins may be used, for example. When the material for the first insulating layer is resin, the thickness of the first insulating layer is preferably 15 to 300 µm in order to secure sufficient insulating property and heat conducting property between the conductive line and the base. Herein, both first conductive line 25a and second conductive line 25b are provided on first insulating layer 26.

First insulating layer 26 is formed by applying a coating solution of insulating layer material on metal plate 27. First insulating layer 26 is formed in order to maintain electric insulation; more specifically, first insulating layer 26 is formed with care to avoid air entrapment and pinholes. The thickness of first insulating layer 26 is 0.1 to 0.2 mm, for example. First insulating layer 26 is a layer made of epoxy resin, for example.

In solar cell 10, base member 37 is provided below substrate 24 with heat dissipation resin 44 in between. Base member 37 is a member for placing a plurality of substrates 24 under sunlight. Base member 37 is made of a material having high heat dissipation property such as an aluminum based material. As base member 37, a metal plate or a ceramic plate having the heat dissipation property may be used, for example. Base member 37 may have a larger surface area in order to increase the heat dissipation property.

Solar Cell

Figure 3:
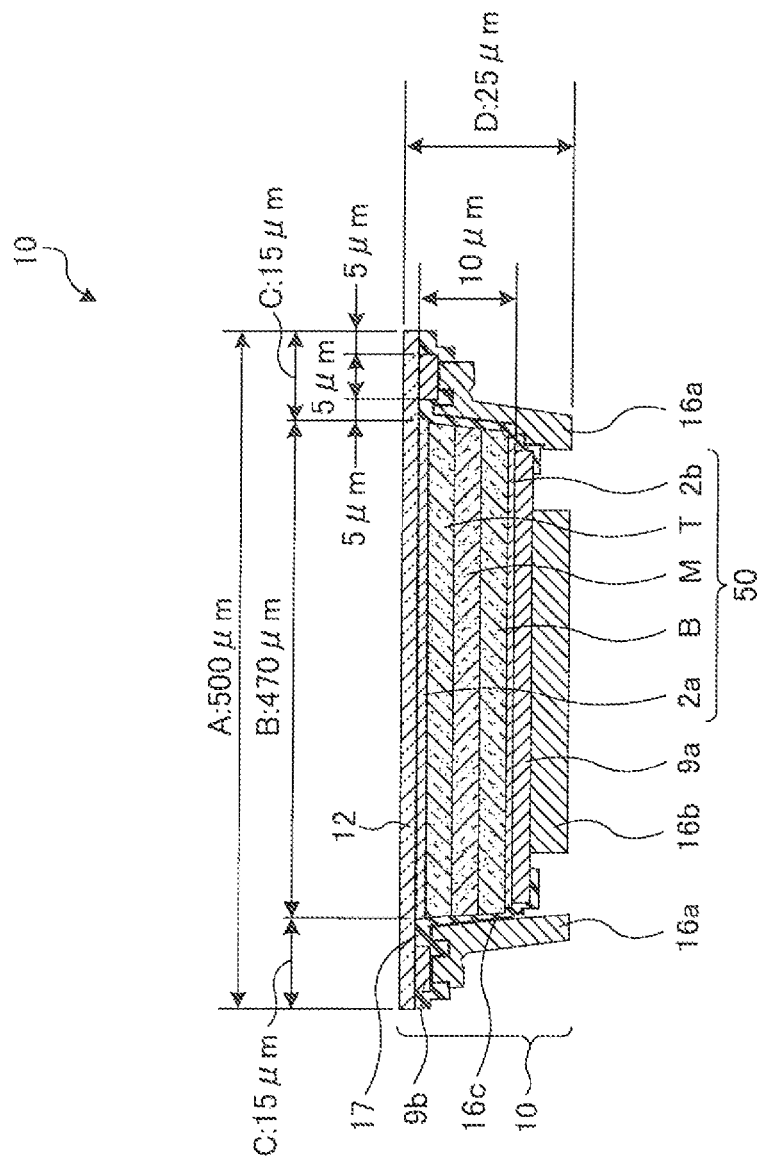
FIG. 3 schematically illustrates a configuration of a solar cell according to the embodiment.

As illustrated in FIG. 3, solar cell 10 is a multijunction solar cell. Solar cell 10 includes: first electrode 9a; bottom cell layer B provided on first electrode 9a; middle cell layer M provided on bottom cell layer B; top cell layer T provided on middle cell layer M; transparent electrode 12 provided on top cell layer T; second insulating layer 17 provided on a side surface of cell laminate 50 including bottom cell layer B, middle cell layer M, and top cell layer T; and second electrode 16a provided on a side surface of cell laminate 50 with second insulating layer 17 in between and electrically connected to transparent electrode 12 and second conductive line 25b. In solar cell 10, electrodes other than transparent electrode 12 are not provided on the light-receiving surface of sunlight, and thus the use efficiency of sunlight is improved.

As long as first electrode 9a is electrically connected to first conductive line 25a, first electrode 9a may be provided directly on first conductive line 25a or over first conductive line 25a with a conductive component interposed in between. Similarly, as long as second electrode 16a is electrically connected to second conductive line 25b, second electrode 16a may be provided directly on second conductive line 25b or over second conductive line 25b with a conductive component interposed in between.

First contact layer 2b is provided between first electrode 9a and bottom cell layer B. In addition, on a side of first electrode 9a opposite to first contact layer 2b, central electrode 16b is provided.

Second conduct layer 2a is provided between top cell layer T and transparent electrode 12. Third electrode 9b is provided between transparent electrode 12 and second electrode 16a. Au/Ti laminate film 16c is provided between second insulating layer 17 and second electrode 16a.

Second contact layer 2a, top cell layer T, middle cell layer M, bottom cell layer B, and first contact layer 2b compose cell laminate 50.

The lower surface of second electrode 16a is preferably formed below the lower surface of first electrode 9a. More preferably, the lower surface of second electrode 16a and the lower surface of central electrode 16b are aligned with each other along broken line LL. With this configuration, in the later-described step of joining solar cell 10 and substrate 24, pressure is evenly applied on solar cell 10 thus preventing damages on solar cell 10. As described above, second electrode 16a having a potential generated at top cell layer T and central electrode 16b having potential generated at bottom cell layer B are provided on the same plane. For this reason, according to solar cell 10, since electrodes connected to outside (an electrode having a potential of a top cell and an electrode having a potential of a bottom cell) are on the same plane, only one step is required for mounting solar cell 10 on an external electrode. Therefore, a production lead time is reduced.

The lower surface of second electrode 16a and the lower surface of central electrode 16b provided on the same surface are electrically connected to first conductive line 25a and second conductive line 25b on substrate 24, respectively, via conductive components. Note that, second electrode 16a and central electrode 16b are provided electrically independent of each other.

First electrode 9a and third electrode 9b are Au plated films having the thickness of approximately 10 μm, for example. Central electrode 16b and second electrode 16a are Au plated films having the thickness of approximately 10 to 50 um, for example. Central electrode 16b and second electrode 16a are formed to have a thickness greater than first electrode 9a and third electrode 9b. Second insulating layer 17 is a SiN film having the thickness of approximately 1 μm, for example. Transparent electrode 12 is a ZnO layer having the thickness of approximately 0.5 μm, for example. The thickness of Au/Ti laminate film 16c is approximately 0.5 μm.

As illustrated in FIG. 3, the width of transparent electrode 12 is, for example, 500 μm. The width of second contact layer 2a is 470 μm, for example. The width of the periphery of transparent electrode 12 is 15 μm, for example. The width of third electrode 9b provided at the center of the periphery is 5 μm, for example. The width of the gap between third electrode 9b and the cell laminate is 5 μm, for example. The width of the gap between third electrode 9b and the edge of transparent electrode 12 is 5 μm, for example. The thickness of the cell laminate is 10 μm, for example. The thickness of solar cell 10 is 25 μm, for example.

Figure 4:
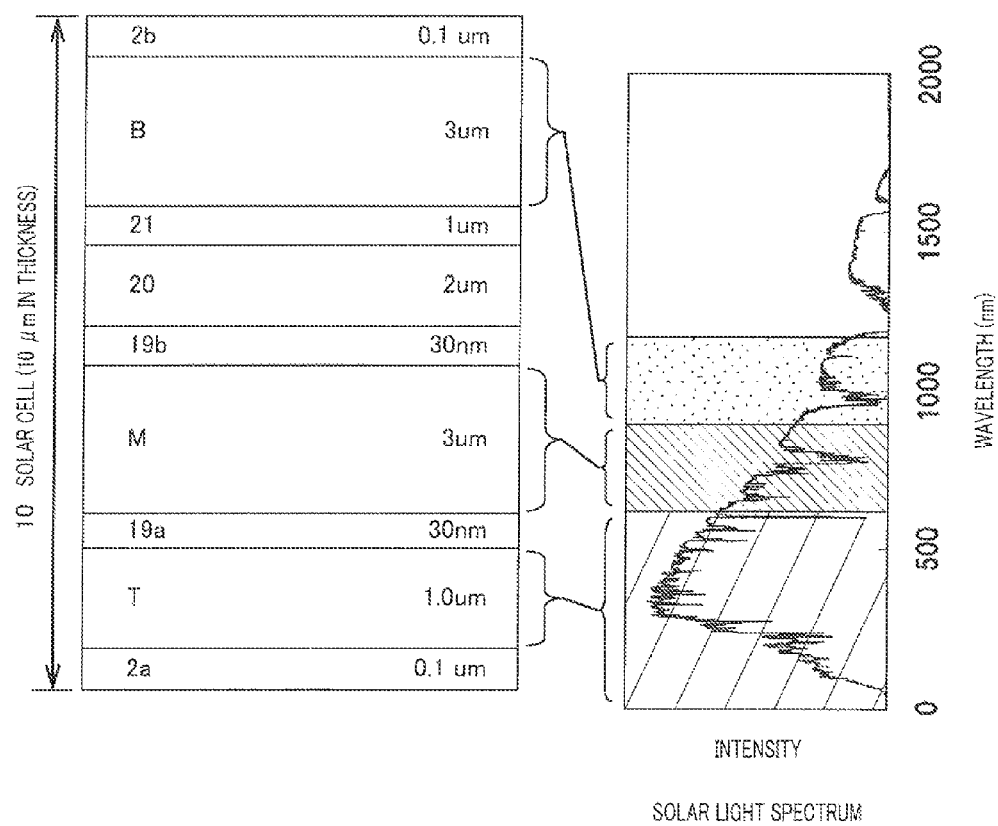
FIG. 4 illustrates a schematic configuration of a cell laminate according to the embodiment and wavelengths of light absorbed by the cell layers.

As illustrated in FIG. 4, the cell laminate includes, first contact layer 2b, bottom cell layer B, buffer layer 21, grid layer 20, tunnel layer 19b, middle cell layer M, tunnel layer 19a, top cell layer T, and second contact layer 2a, for example.

Top cell layer T has the band gap of 1.87 eV, and is capable of absorbing light having a wavelength of 650 nm or shorter in the spectrum of sunlight. The middle cell layer M has the band gap of 1.41 eV, and is capable of absorbing light having a wavelength in a region from 650 nm to 900 nm. The bottom cell layer B has the band gap of 1.0 eV, and is capable of absorbing light having a wavelength in a region from 900 nm to 1,200 nm in the spectrum of sunlight.

The multijunction solar cell includes a first electrode electrically connected to a first conductive line, a bottom cell layer provided on the first electrode, a top cell layer provided on the bottom cell layer, a transparent electrode provided on the top cell layer, an insulating layer provided on a side surface of the cell laminate including the bottom cell layer and the top cell layer, and a second electrode provided on a side surface of the cell laminate with the insulating layer in between and is electrically connected to the transparent electrode and the second conductive line.

The first electrode is composed of a conductive layer such as a metal layer.

The cell laminate includes a bottom cell layer and a top cell layer. The bottom cell layer has a photovoltaic property, and has the lowest band gap among the layers in the cell laminate. The top cell layer has a photovoltaic property, and has the highest band gap among the cell laminate. The cell laminate may include one or more middle cell layers between the bottom cell layer and the top cell layer, having a band gap between the band gaps of the bottom cell layer and the top cell layer.

The transparent electrode is formed on the top cell layer of the cell laminate. The transparent electrode may be formed by a common method for forming a transparent electrode at a desired position. As the material for the transparent electrode, zinc oxide (ZnO), ITO or IZO, or a transparent graphene conductive film may be used, for example.

An insulating layer in the multijunction solar cell (hereafter may also be referred to as "second insulating layer") is formed on a side surface of the cell laminate. The second insulating layer may be formed from the side surface of the cell laminate to the side surface of the first electrode. As the material for the second insulating layer, SiN, BN, SiO, and the same material for the first insulating layer may be used, for example.

The second electrode is formed on the second insulating layer on the side surface of the cell laminate. The second electrode may be formed apart from the second insulating layer. The material for the second electrode may be used as the material for the first electrode. It is preferable that the second electrode is formed as far as to a region near, but apart from, the side of the first electrode such that the second electrode is electrically connected to a conductive line on the surface of the substrate more easily.

The multijunction solar cell may include additional component(s), as long as the effect of the present invention is achieved. The components may be, for example, a third electrode for electrically connecting the transparent electrode and the second electrode, a first contact layer for increasing the electric contact between the bottom cell layer and the first electrode, a second contact layer for increasing the electric contact between the top cell layer and the transparent electrode, and a central electrode for increasing the electric contact between the first electrode and the first conductive line. The contact layers may be appropriately chosen according to the materials for the top cell layer and the bottom cell layer.

Lens

Lens 31 is composed of a resin less tolerant to heat than glass. The resin is a transparent resin such as acrylic resin or silicone resin. Lens 31 is a compound eye lens including a plurality of plano-convex lens parts arranged on a flat surface, for example.

Lens 31 is formed of a transparent resin. Each plano-convex lens part has planar focal point 32 identical in shape to transparent electrode 12 of solar cell 10, for example on a surface opposite to a surface which is the light incident surface. The planar shape of lens 31 (as viewed from X direction of the arrow in FIG. 1) is a square of approximately 50 mm each side. The thickness Tc of lens 31 is 17 mm, for example. The number of individual lenses and focal points 32 in lens 31 may be determined by the concentration ratio of each lens. For example, when the concentration ratio of each lens is ×400, the size of each lens is 10 mm square. Accordingly, lens 31 includes 25 (5 by 5) lenses. When the concentration ratio of each lens is ×1,000, the size of each lens is 16 mm square. Accordingly, lens 31 includes 9 (3 by 3) lenses. The transparent resin contains an ultraviolet absorber, for example. Accordingly, lens 31 can maintain transparency even when left under sunlight for a long time, without turning yellow.

Although the lens according to Embodiment is a plano-convex lens, a Fresnel lens or a Cassegrain focusing lens may be used as well.

The lens is closely attached to the transparent electrode. The lens has a focal point at the transparent electrode. Here, "focal point" refers to a region in cross section, perpendicular to the focal length direction, of the optical path of sunlight converging on the cell laminate. The focal point may be a region at any position in the light path other than the location of the cell laminate. For example, the focal point may be at the surface of the transparent electrode; at a part on the surface of the lens where the light passes, opposite to the incident surface; or the focus point. The lens is usually a plano-convex lens having the convex surface facing toward the Sun.

The lens is formed of a transparent material. As the material for the lens, glass, and a transparent resin may be used. As the transparent resin, acrylic resin or silicone resin may be used, for example. In terms of heat resistance, a lens made of an inorganic material such as glass is preferable. In terms of reducing the weight of the lens, a lens made of transparent resin is preferable. More particularly, in terms of productivity and economic performance, a lens made of acrylic resin is more preferable.

Structure of Stopper for Lens

Lens 31 includes a plurality of projections 33 provided corresponding to respective tapered holes 28 in substrate 24. Projections 33 are provided at regular interval in the same manner as tapered holes 28. Projections 33 are integrally formed with lens 31.

Tapered Part of Projection

As illustrated in FIG. 1, projection 33 includes pillar 33a projecting from the back surface of lens 31, and tapered part 33b provided at the tip of pillar 33a. The taper angle of tapered part 33b is the same as the taper angle of tapered hole 28. The taper angle at the tapered part and the tapered hole is preferably 30 to 60° in order to facilitate the fitting of the tapered part and the tapered hole, to improve the formability of the tapered hole, and to improve the formability of the lens and the projection when they are formed by resin molding. For example, in projection 33, the diameter of pillar 33a is 20 to 50 μm, the height of pillar 33a is 20 to 30 μm, and the height of tapered part 33b is 20 to 70 μm.

The height of pillar 33a is determined based on the thickness (height) of solar cell 10. For example, when the thickness of solar cell 10 is 25 μm, the height of pillar 33a is 25 μm as well.

In addition, in order to facilitate appropriate positioning of the substrate, the multijunction solar cell, and the lens, it is even more preferable that the pillar, the tapered part, and the tapered hole are provided at positions suitable for arranging the lens on the substrate with the multijunction solar cell in between.

Transparent Adhesive

Transparent electrode 12 of solar cell 10 is bonded by transparent adhesive 35 at a focal point of lens 31. Transparent adhesive 35 is made of an epoxy material or a silicone material. As transparent adhesive 35, a two-component adhesive may be used that includes a main agent made of resin material and a curing agent made of resin material to be mixed with the main agent. Also, a UV curable resin material may be used.

Sealing Resin

As illustrated in FIG. 1 and FIG. 2, the gaps between substrate 24 and lens 31 are sealed by sealing resin 22 in order to increase the mechanical strength and improve chemical resistance. By sealing resin 22, substrate 24, solar cell 10, and lens 31 are integrated to one another. The sealing resin is advantageous to reduce the concentration of stress due to the heat on the lens under sunlight. As the sealing resin, for example, epoxy resins, phenol resins, fluorine resins, polyimide resins, silicone resins, and acrylic resins may be used.

The solar cell battery according to the present invention may include additional component(s) as long as the effect of the present invention is achieved. For example, the solar cell battery according to the present invention may further include a spacer for supporting the lens over the substrate. As the spacer, a member that supports the lens over the substrate with the distance between the two components being approximately the same as the height of the multijunction solar cell on the substrate (e.g., when the height of multijunction solar cell on the substrate is defined as $H_0$, $H_0+10\%$) may be used. Examples of the spacer include the pillar projecting from the surface of the lens or the substrate, provided on at least one of the lens or the substrate, and spherical particles dispersed between the substrate and the lens. When the lens is supported over the substrate, the spacer may be present between the lens and substrate either with its shape being intact or crushed. In consideration of the latter case, spherical particles having diameter of $H_0$-10 μm to 30$H_0$ may be used as the spacer.

The spacer is preferably the pillar projecting from the surface of the lens, in order to improve the productivity when the lens is formed by resin molding and to reduce thermal stress from the lens heated by sunlight. The pillar is provided on the surface of lens, opposite to the light incident surface. It is preferable that a plurality of pillars is provided for one lens in order to reduce the thermal stress.

The solar cell battery according to the present invention may further include an anisotropic conductive film (ACF) present between the first electrode and the first conductive line, and between the second electrode and the second conductive line. A thermosetting resin film in which conductive particles are dispersed may be used for the ACF, for example. It is preferable that the solar cell battery according to the present invention further includes the ACF in order to perform electric connection and bonding of the substrate and the multijunction solar cell simultaneously and easily.

The solar cell battery according to the present invention may have the configuration in which a plurality of the single unit described above is integrated with one another. For example, the solar cell battery according to the present invention may be configured such that a plurality of multijunction solar cells is provided on one substrate, wherein the lens is a compound eye lens that has a focal point at each of the transparent electrodes that are closely in contact with the lens. The substrate on which a plurality of the multijunction solar cells is provided includes the first conductive lines and the second conductive lines at the positions where multijunction solar cells are provided. In addition, the compound eye lens may be formed of a frame assembly in which a plurality of tubular frames is bundled and plano-convex lenses provided in the respective frames.

Alternatively, the compound eye lens may be composed of, for example, a resin lens having a plurality of plano-convex lenses arranged side-by-side.

The solar cell battery according to the present invention may further include a preliminary light focusing lens provided apart from the lens closely attached to the transparent electrode, for collecting sunlight toward the lens. It is expected that the preliminary light focusing lens will reduce the thickness of the lens closely attached to the transparent electrode, and suppress the increase in the temperature of the lens.

Method for Manufacturing Solar Cell Battery

The solar cell battery according to the present invention may be manufactured by the following method. The manufacturing method of the solar cell battery according to the present invention includes a step of providing the lens, a step of providing a multijunction solar cell, and a step of providing a substrate.

In the step of providing the lens, a lens having a focal point on the surface opposite to the light incident surface is provided. The focal point is a part of the surface of the lens where the transparent electrode is bonded, or a smaller region included in the part. The lens can be prepared by attaching a plano-convex lens to the frame described above or by molding transparent resin.

The step of preparing the multijunction solar cell includes a step of forming a cell laminate on a sacrificial layer on a growth substrate, a step of forming the first electrode on the cell laminate formed, a step of forming the second insulating layer on the side of the cell laminate formed, and a step of forming the second electrode on the second insulating layer.

The step of forming the cell laminate may be performed by sequential epitaxial growth of the materials of the cell layers (e.g., Group III-V compounds) on the sacrificial layer on the growth substrate in the order from the top cell layer to the bottom cell layer. The step of forming the first electrode and the step of forming the second electrode may be performed by an appropriate method according to the size of the cell laminate and the material of the layer to be formed, among common layer formation methods. When the thickness of the cell laminate is a few μm to a few tens μm, for example, the step of forming the first electrode and the step of forming the second electrode may be a common method for forming a conductive layer in a desired shape (e.g., photolithography, plating, or etching). In addition, the step of forming the second insulating layer may be performed by a common method for forming an insulating layer of a desired shape according to the material of the second insulating layer (e.g., plasma CVD, dry etching, or photolithography).

The step of providing the multijunction solar cell further includes a step of separating the manufactured article on the growth substrate obtained in the step described above from the sacrificial layer and a step of forming a transparent electrode on the top cell layer of the manufactured particle separated. As a step of separating the manufactured article from the sacrificial layer, a common method for separating a semiconductor laminate on the growth substrate via the sacrificial layer from the sacrificial layer may be adapted, for example. A step of forming the transparent electrode may be performed by a common method for forming a transparent electrode at a desired position, according to the material of the transparent electrode.

The step of providing the multijunction solar cell may include additional steps such as a step of forming the third electrode, a step of forming a central electrode and others. The additional steps may be performed by a common method according to the size of the cell laminate and the materials of the layers to be formed.

The step of providing the substrate may be performed by providing the first conductive line and the second conductive line electrically independent of each other on the base, for example. The conductive lines are formed by a common method for forming a metal layer having a desired planar shape. When the base is conductive, the first insulating layer is additionally formed between the base and the conductive line. The first insulating layer is formed by photolithography.

The method for manufacturing the solar cell battery further includes a step of bonding the multijunction solar cell to the lens, and bonding the multijunction solar cell bonded to the lens to the substrate.

When bonding the multijunction solar cell to the lens, the multijunction solar cell is bonded to the lens such that the transparent electrode is provided on the focal point of the lens. The multijunction solar cell is bonded to the lens using a regular liquid transparent adhesive according to the material of the surfaces to be bonded. It is preferable that liquid repelling treatment is performed on the surface of the lens other than the focal point, and the transparent adhesive is applied only on the focal point in order to facilitate the positioning of the bonding position of the multijunction solar cell to the focal point.

In the step of bonding the multijunction solar cell bonded to the lens and the substrate, the multijunction solar cell and the substrate are bonded such that the first electrode is electrically connected to the first conductive line, and the second electrode is electrically connected to the second conductive line. The position for bonding the multijunction solar cell bonded to the lens and the substrate can be checked by an image of the bonding position captured by a camera, for example.

The multijunction solar cell bonded to the lens and the substrate can be bonded by a transparent adhesive. It is preferable that the multijunction solar cell bonded to the lens and the substrate are bonded by thermally curing a thermosetting transparent adhesive in order to adjust the bonded position after the transparent adhesive is applied, and to bond the solar cell and the substrate at the bonding position adjusted.

The method for manufacturing the solar cell battery according to the present invention may include additional step(s). The method for manufacturing the solar cell battery according to the present invention may further include a step of supporting the lens, over the substrate, to which the multijunction solar cell is bonded by a spacer, for example. The lens may be supported over the substrate by means of a spacer by dispersing spherical particles before bonding the multijunction solar cell and the substrate, for example.

Supporting of the lens over the substrate by means of the space may be accomplished by a lens or substrate having pillars. Furthermore, when a lens having pillars and tapered parts and a substrate having tapered holes are used, the fitting of the tapered parts into the tapered holes may be used for adjusting the bonding position of the multijunction solar cell and the substrate.

For example, the pillar and the tapered part are formed on the surface of the lens opposite to the light incident surface. In addition, the tapered holes are formed in the substrate at positions where the multijunction solar cells are to be provided. In this case, by fitting the tapered part into the tapered hole, the position for bonding the multijunction solar cell with respect to the substrate can be appropriately determined.

In terms of positioning the bonding position of the multijunction solar cell with respect to the substrate and in terms of supporting the lens on the substrate with an appropriate distance therebetween, it is preferable that three or more pairs of tapered parts and the tapered holes are provided on the same substrate and the same lens. In order to reduce the thermal stress caused by the heat of the lens, the tapered parts and the tapered holes are preferably provided at a density of 4 pairs/100 mm square, and more preferably 4 to 16 pairs/5 cm square. In addition to reducing the thermal stress, the tapered parts and the tapered holes are preferably provided even more densely in order to increase the accuracy on positioning the lens and the substrate. The accuracy of the positioning may be determined based on the concentration ratio of the lens and the size of the multijunction solar cell (e.g., the size of the focal point). For example, when the concentration ratio of the lens is ×500 and the size of the multijunction solar cell is a square having a side of 0.5 mm, the tapered parts and the tapered holes are preferably provided at a density of 1 to 4 pairs/cm$^2$.

Furthermore, the method for manufacturing the solar cell battery according to the present invention may include the step of placing the ACF between the multijunction solar cell and the substrate. The step is advantageous to electrically connect and bond the substrate and the multijunction solar cell simultaneously and easily. The step of placing the ACF may be performed by a step of placing the ACF on the first conductive line and the second conductive line of the substrate, and bonding the multijunction solar cell bonded to the lens on the substrate on which the ACF is placed by thermocompression bonding. In the step of placing the ACF on the conductive line, the ACF may be temporarily bonded to the substrate by heating and pressurizing the ACF until the ACF is partially cured.

The method for manufacturing the solar cell battery according to the present invention may form an array of a plurality of solar cells by using a compound eye lens as the lens, and a substrate having the first conductive line and the second conductive line at positions corresponding to focal points. In this case, the multijunction solar cell is bonded to each of the focal points of the compound eye lens, and the multijunction solar cells are connected to the first conductive line and the second conductive line corresponding to the focal points.

The method for manufacturing the solar cell battery according to Embodiment will be described below. First, provision of solar cell 10 will be described.

Method for Manufacturing Cell Laminate

The cell laminate is obtained by forming, on GaAs substrate 1, metal layers for the cell layers. The metal layers may be formed by charging corresponding materials into a vertical metal organic chemical vapor deposition (MOCVD) apparatus, and allowing the materials to be epitaxially grown.

The epitaxial growth of each metal layer is performed by a common method. The epitaxial growth of each metal layer can be performed under an ambient temperature of approximately 700° C., for example. As a material for growing a GaAs layer, trimethylgallium (TMG) and AsH$_3$ (arsine) may be used. As a material for growing an InGaP layer, trimethylindium (TMI), TMG, and PH$_3$ (phosphine) may be used. In addition, as an impurity for forming an n-type GaAs layer, an n-type InGaP layer, and an n-type InGaAs layer, SiH$_4$ (monosilane) may be used. As an impurity for forming a p-type GaAs layer, a p-type InGaP layer, and a p-type InGaAs layer, diethylzinc (DEZn) may be used.

First, an AlAs layer having the thickness of approximately 100 nm is folined as sacrificial layer 4 by epitaxial growth on GaAs substrate 1 as the growth substrate. Next, as second contact layer 2a, an n-type InGaP layer having the thickness of approximately 0.1 µm is formed by epitaxial growth (see FIG. 4).

Next, top cell layer T is formed. The following layers are epitaxially grown: an n-type InAlP layer having the thickness of approximately 25 nm as a window; an n-type InGaP layer having the thickness of approximately 0.1 µm as an emitter; a p-type 1+InGaP layer having the thickness of approximately 0.9 µm as a base, and a p-type InGaP layer having the thickness of approximately 0.1 µm an as a BSF. As a result, top cell layer T having the thickness of approximately 1 µm is formed.

After top cell layer T is formed, a p-type AlGaAs layer having the thickness of approximately 12 nm and an n-type GaAs layer having the thickness of approximately 20 nm are epitaxially grown as a tunnel layer. As a result, tunnel layer 19a having the thickness of approximately 30 nm is formed.

Next, middle cell layer M is formed. The following layers are epitaxially grown: an n-type InGaP layer having the thickness of approximately 0.1 µm as a window; an n-type GaAs layer having the thickness of approximately 0.1 µm as an emitter; a p-type GaAs layer having the thickness of approximately 2.5 µm as a base; and a p-type InGaP layer having the thickness of approximately 50 nm as a BSF. As a result, middle cell layer M having the thickness of approximately 3 µm is formed.

After middle cell layer M is formed, a p-type AlGaAs layer having the thickness of approximately 12 nm, an n-type GaAs layer having the thickness of approximately 20 nm, a tapered part, and a tapered hole are formed as tunnel layer 19b by epitaxial growth. As a result, tunnel layer 19b having the thickness of approximately 30 nm is formed.

Subsequently, grid layer 20 is formed. Grid layer 20 suppresses dislocation, defects, and others caused by the mismatch in the lattice constant. Eight n-type InGaP layers each having the thickness of approximately 0.25 µm are formed, composing grid layer 20 having the thickness of approximately 2 µm. In addition, an n-type InGaP layer having the thickness of approximately 1 µm is formed as buffer layer 21.

Subsequently, bottom cell layer B is formed. The following layers are formed by epitaxial growth: an n-type InGaP layer having the thickness of approximately 50 nm as a passivation film; an n-type InGaAs layer having the thickness of approximately 0.1 µm as an emitter; a p-type InGaAs layer having the thickness of approximately 2.9 µm as a base, and a p-type InGaP layer having the thickness of approximately 50 nm as a passivation film. As a result, bottom cell layer B having the thickness of approximately 3 µm is formed. Finally, as first contact layer 2b, a p-type InGaAs layer having the thickness of approximately 0.1 µm is formed by epitaxial growth.

Method for Manufacturing Solar Cell

A flow for manufacturing a compound solar cell will be described with reference to FIG. 5A to FIG. 9D. In the step illustrated in FIG. 5A, a disc-shaped GaAs substrate 1 (wafer) is prepared. The size of GaAs substrate 1 is, for example, 4 inches (10.16 cm) in diameter and 500 µm in thickness. Usually, a plurality of solar cells 10 is formed on one GaAs substrate 1.

Figure 5A:
FIGS. 5A to 5D illustrate the first part of the manufacturing process of the solar cell according to the embodiment.
Figure 5B:
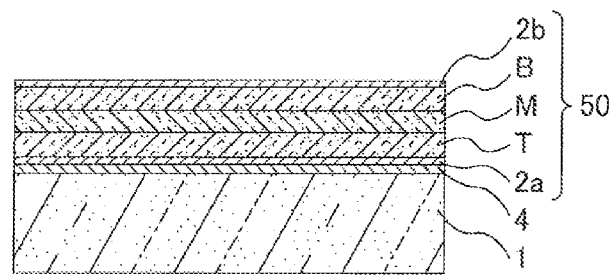

In the step in FIG. 5B, cell laminate 50 is formed on GaAs substrate 1. As described earlier with reference to FIG. 4, cell laminate 50 is formed by forming, for example, second contact layer 2a, top cell layer T, tunnel layers 19a and 19b, middle cell layer M, grid layer 20, buffer layer 21, bottom cell layer B, and first contact layer 2b on sacrificial layer 4 by epitaxial growth. The height of the cell laminate is, for example, 10 µm.

Figure 5C:
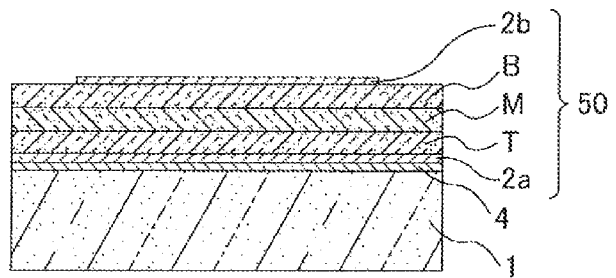

In the step in FIG. 5C, first contact layer 2b having the thickness of approximately 0.1 µm is patterned into a desired planar shape. It is preferable that the patterning is performed by dry etching.

Figure 5D:
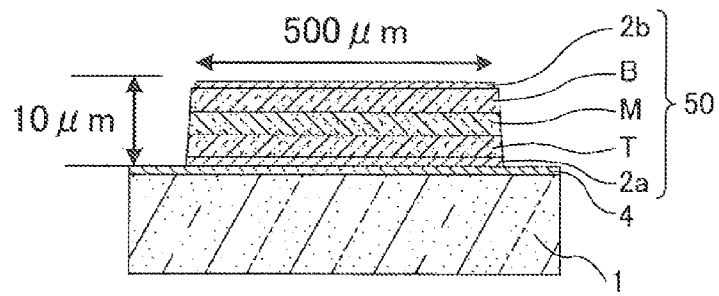

In the step illustrated in FIG. 5D, cell laminate 50 having the thickness of 10 µm is patterned into a predetermined planar shape. The size of the planar shape by patterning (for example, diameter of a disc or a length of a rectangle) is 500 µm, for example. It is preferable that the patterning is performed by dry etching.

It is shown that loss of carrier around the solar cell is suppressed by placing the cell laminate inside the outer edge of GaAs substrate 1, improving the conversion efficiency. The structure described above where the cell laminate on the edge is etched may be referred to as the "Ledge structure." As described in "J. Vac. Sci. Technol. B, Vol. 11, No. 1, January/February 1993" and "The Institute of Electronics, Information and Communication Engineers, IEICE Technical Report, ED2007-217, MW2007-148 (2008-1)", it is known that carriers tend to be lost at the edge of a P-N junction. In contrast, with the "Ledge structure", the carriers are concentrated inside of the substrate, suppressing the carrier loss at the edge.

Figure 6A:
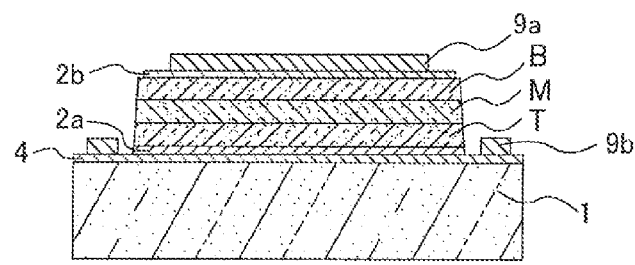
FIGS. 6A to 6C illustrate the second part of the manufacturing process of the solar cell according to the embodiment.

In the step in FIG. 6A, an Au plated electrode is formed as third electrode 9b and first electrode 9a. First, an Au plated film having the thickness of approximately 10 µm or less is formed on the entire upper surface of the cell laminate illustrated in FIG. 5D by electroplating. Third electrode 9b and first electrode 9a are formed by patterning the Au plated film. The patterning is performed by photolithography and wet etching.

Figure 6B:
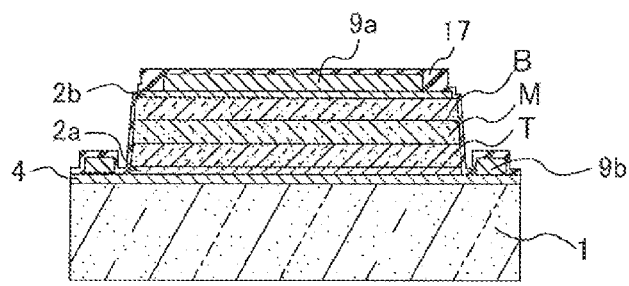

In the step in FIG. 6B, an SiN film is formed as second insulating layer 17. For example, an SiN film is formed on the entire upper surface of the cell laminate by plasma CVD.

Figure 6C:
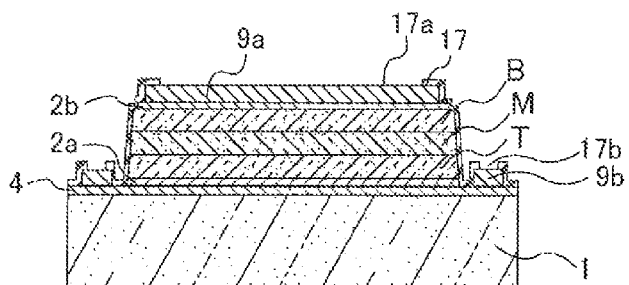

In the step in FIG. 6C, an unnecessary part of second insulating layer 17 is removed, forming windows 17a and 17b of second insulating layer 17. Through windows 17a and 17b of second insulating layer 17, Au plated surfaces composing first electrode 9a and third electrode 9b are exposed, respectively.

Figure 7A:
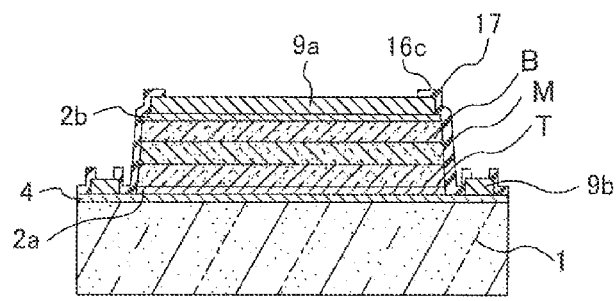
FIGS. 7A to 7C illustrate the third part of the manufacturing process of the solar cell according to the embodiment.

In the step in FIG. 7A, Au/Ti laminate film 16c is formed on the entire upper surface of the cell laminate obtained in the step in FIG. 6C by metal sputtering. Au/Ti laminate film 16c is a pre-process film for electro Au plating in the next step.

Figure 7B:
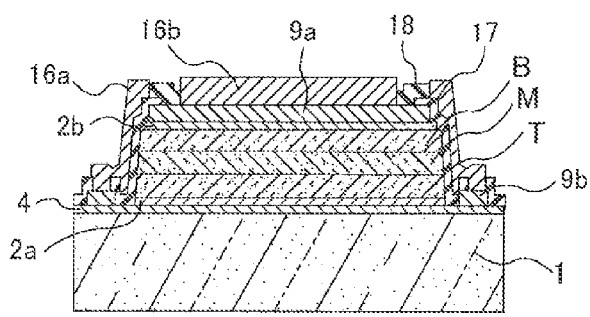

In the step illustrated in FIG. 7B, resist 18 is formed at a part where it is not necessary to form an electro Au plated film. First, Au/Ti laminate film 16c is coated with a material for the resist. Subsequently, the resist material is exposed to light through a predetermined resist pattern for mesa etching. After that, an unnecessary part is removed by etching using an alkali solution or an acid solution. In the manner described above, resist 18 is formed.

Subsequently, central electrode 16b and second electrode 16a are formed by electro Au plating. Central electrode 16b and second electrode 16a made of Au plated films are formed to have the thickness of 10 to 50 µm, which is greater than 10 µm, the thickness of the cell laminate of the solar cell.

Figure 7C:
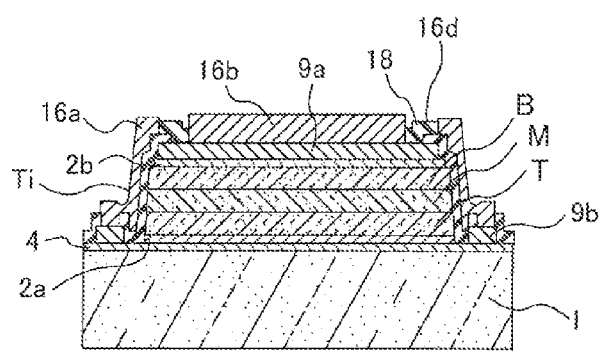

In the step illustrated in FIG. 7C, Ti film 16d for protecting Au plating is formed. Ti film 16d is formed on the entire upper surface of the cell laminate obtained in the step in FIG. 7B. Ti film 16d is formed by metal sputtering.

Figure 8A:
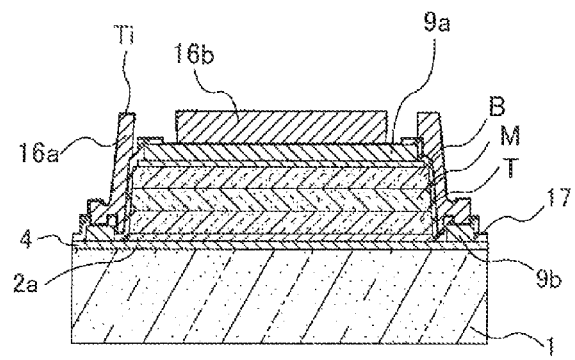
FIGS. 8A to 8C illustrate the fourth part of the manufacturing process of the solar cell according to the embodiment.

In the step illustrated in FIG. 8A, resist 18 in FIG. 7C is removed. Resist 18 is removed by wet process. Resist 18 is removed by etching using an alkali solution and an acid solution, for example.

Figure 8B:
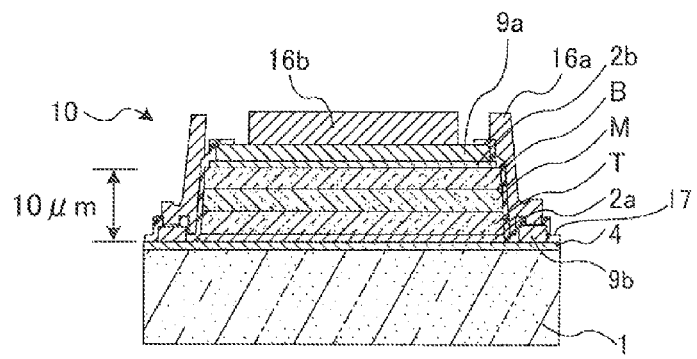

In the step in FIG. 8B, Au/Ti film 16c on second insulating layer 17 and Ti film 16d on the Au plated electrode (central electrode 16b and second electrode 16a) are removed. The removal is performed by the dry edge method. In the manner described above, the uppermost surface of the Au plated electrode is a clean surface without contamination of an organic substance.

Figure 8C:
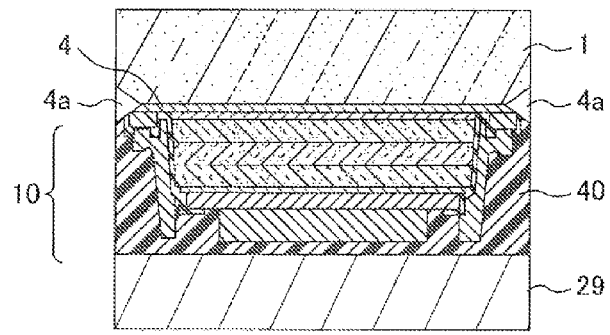

In the step in FIG. 8C, sacrificial layer recess 4a is formed on the side surface of sacrificial layer 4 for separating solar cell 10 from GaAs substrate 1. Since solar cell 10 is extremely fragile, solar cell 10 may be destroyed by the stress exerted when separating solar cell 10 from GaAs substrate 1. Accordingly, as a starting point for internally breaking sacrificial layer 4 securely, sacrificial layer recess 4a is formed. Sacrificial layer recesses 4a may be provided at sacrificial layer 4 as starting points for breaking sacrificial layer 4 by providing a mechanically "scribed" recess, grinding by a blade, or grinding by a water jet, for example. Since solar cell 10 is fixed on working substrate 29, solar cell 10 is not broken when sacrificial layer recess 4a is formed.

Figure 9A:
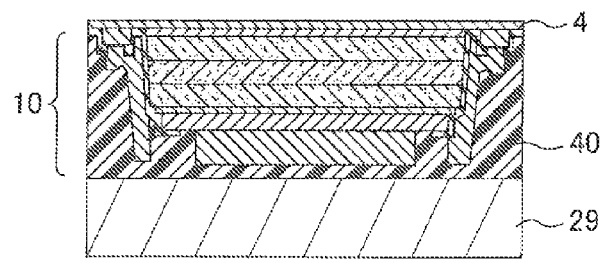
FIGS. 9A to 9D illustrate the fifth part of the manufacturing process of the solar cell according to the embodiment.

In the step in FIG. 9A, sacrificial layer 4 is internally broken so as to remove GaAs substrate 1. Examples of a method for internally breaking sacrificial layer 4 include a number of techniques related to silicon on insulator (SOI) such as dicing, roller separation, water jet, ultrasonic disintegration, and others. Accordingly, GaAs substrate 1 is easily separated.

The lattice constant of GaAs composing GaAs substrate 1 is 5.653 angstrom, and the lattice constant of AlAs composing sacrificial layer 4 is 5.661 angstrom. Accordingly, the lattice constants are substantially identical. Therefore, sacrificial layer 4 is a stable film, and can be internally broken stably.

Figure 9B:
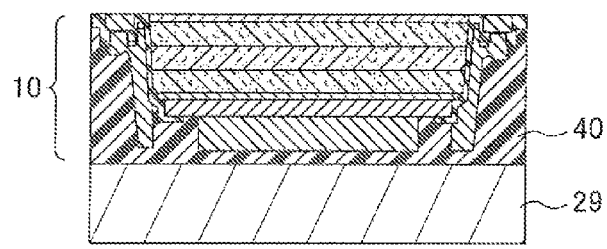

In the step in FIG. 9B, sacrificial layer 4 remaining in solar cell 10 is removed by wet etching. Wet etching of sacrificial layer 4 is performed by melting residual sacrificial layer 4 by contact with hydrogen fluoride for 2 to 3 minutes.

Figure 9C:
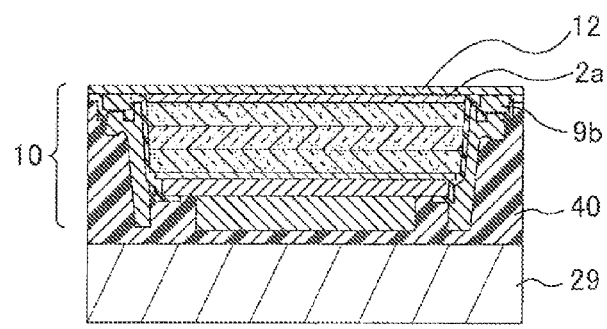

In the step in FIG. 9C, transparent electrode 12 is formed on second contact layer 2a. Transparent electrode 12 composes an incident surface for sunlight in solar cell 10. Transparent electrode 12 is a ZnO layer or an ITO layer, and may be formed by sputtering. Transparent electrode 12 is formed on the entire upper surface of solar cell 10, and electrically connects second contact layer 2a and third electrode 9b. By adding at least 0.1 mass % of Al and Ga to the ZnO layer, the conductivity can be increased further.

Figure 9D:
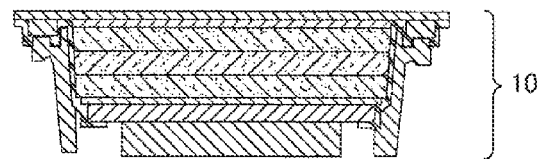
Figure 10:
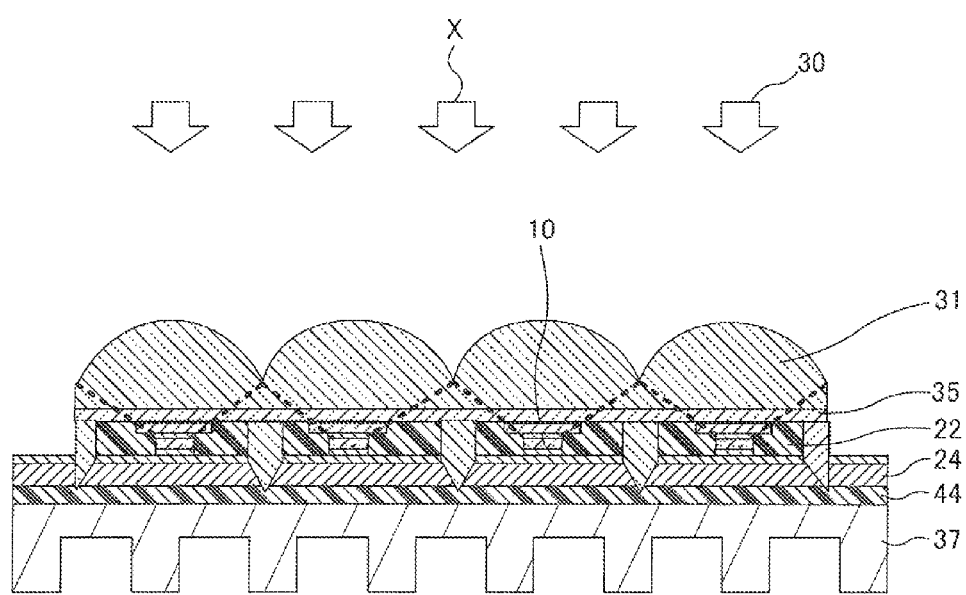
FIG. 10 schematically illustrates an overall configuration of a solar cell battery according to the embodiment.
Figure 11:
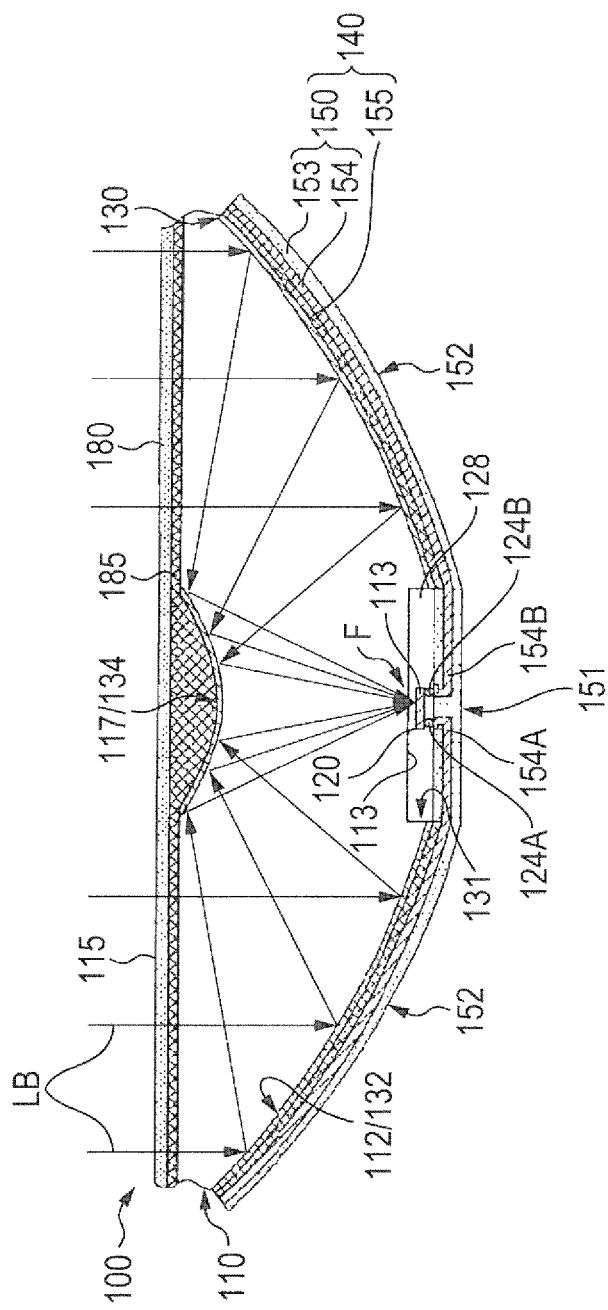
FIG. 11 schematically illustrates the configuration of the first example of a conventional solar cell battery.
Figure 12:
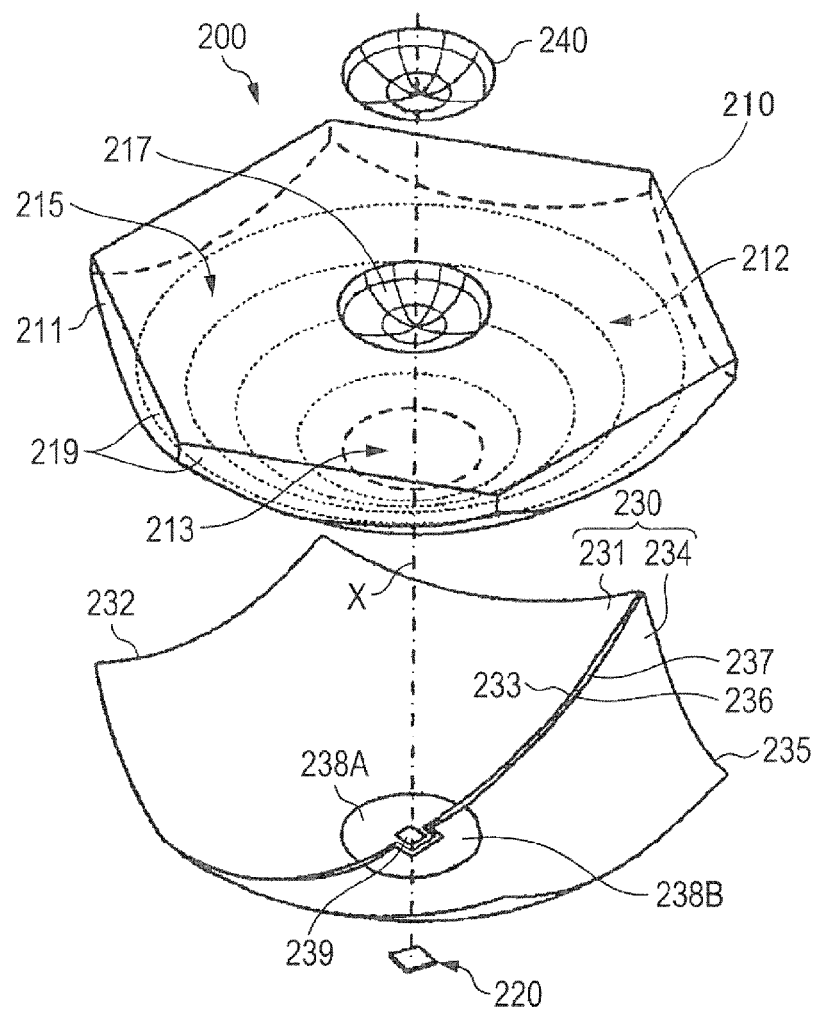
FIG. 12 schematically illustrates the configuration of the second example of a conventional solar cell battery.
Figure 13:
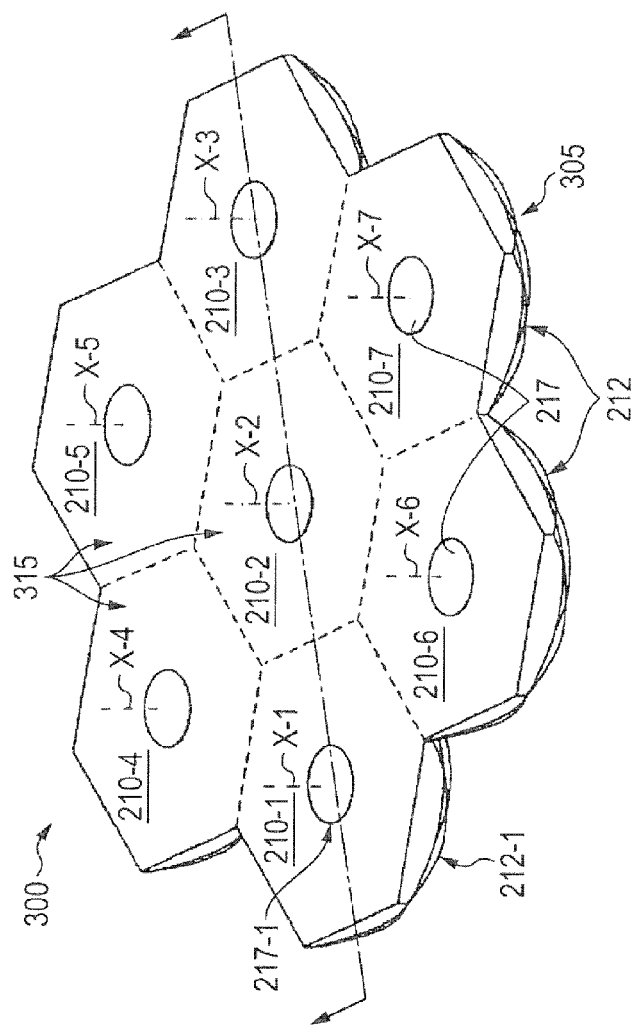
FIG. 13 schematically illustrates the configuration of the third example of a conventional solar cell battery.
Figure 14:
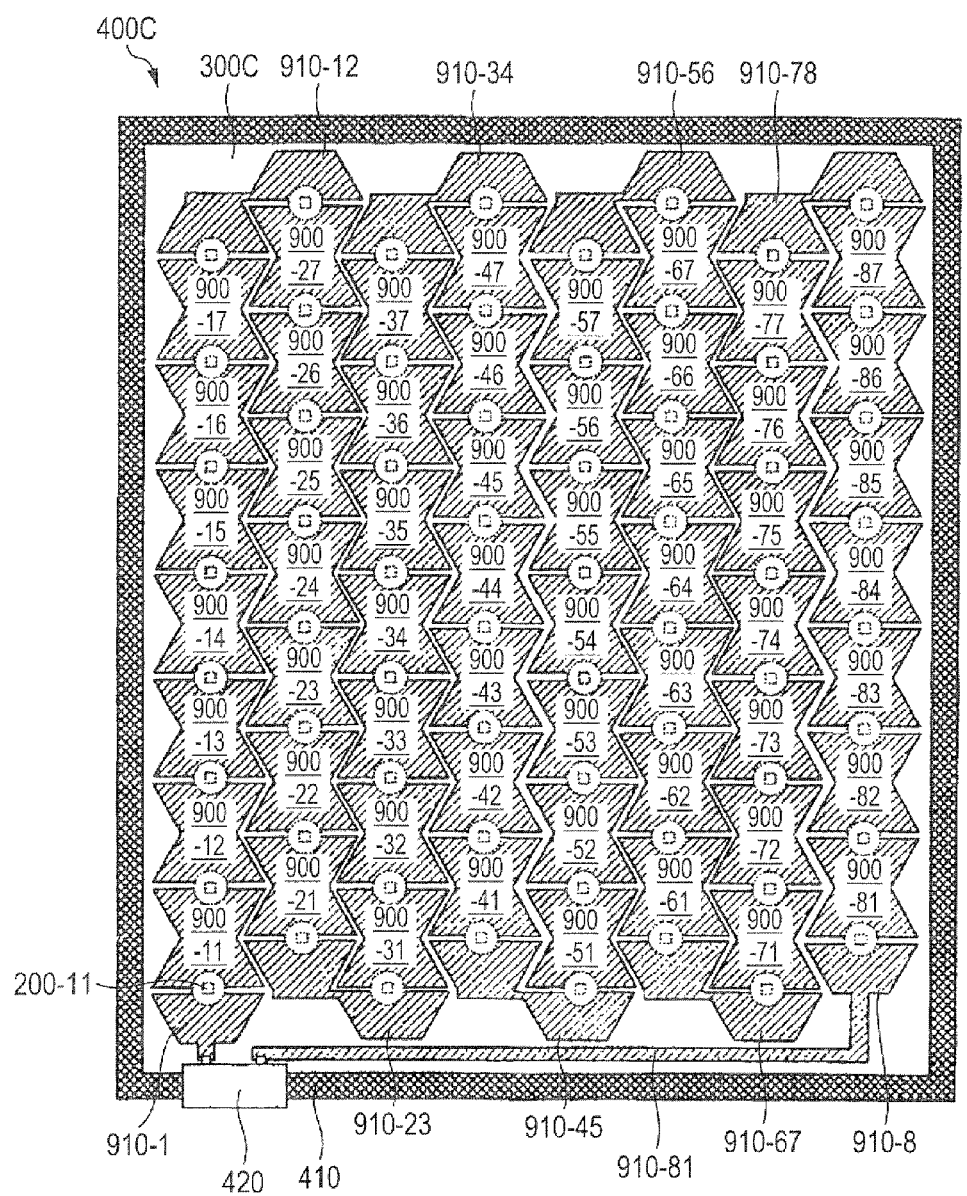
FIG. 14 schematically illustrates the configuration of the fourth example of a conventional solar cell battery.

As illustrated in FIG. 9D, solar cell 10 is removed from wax 40. Solar cell 10 in FIG. 10 obtained through the steps described above does not have an electrode blocking sunlight on the incident surface of sunlight. Accordingly, the amount of sunlight entering solar cell 10 increases, improving the power generation efficiency of solar cell 10.

Method for Manufacturing Lens

Lens 31 is formed by molding a transparent acrylic resin or transparent silicone resin material. The molding step may be performed by injection molding or transfer molding using a mold. Projection 33 is formed simultaneously as lens 31 by additionally forming a part for forming projection 33 on a mold for lens 31, and using the mold.

Method for Manufacturing Substrate

Substrate 24 is formed by placing first insulating layer 26 and first conductive line 25a and second conductive line 25b according to the arrangement of solar cell 10 and focal points of lens 31, and forming tapered hole 28. Substrate 24 is manufactured by a common method for manufacturing a substrate having lines on the surface.

<Liquid Repellant and Liquid Affinity Treatment on Back Surface of Lens>

Among the surfaces of lens 31, liquid repellant treatment is performed on the back surface of lens 31, which is the surface on which transparent electrode of solar cell 10 is bonded. More specifically, liquid repellant treatment is performed on the back surface of lens 31 other than focal points. The liquid repellant treatment is performed by chemical modification by silane coupling agents having a fluorocarbon chain such as $CF_3(CF_2)_7C_2H_4SiCl_3$ or a hydrocarbon chain such as $CH_3(CH_2)_{17}SiCl_3$, for example.

The focal point has a surface made of a resin material of lens 31. Without any treatment, the focal point is lyophilic to a transparent adhesive. The liquid repellant treatment makes a region other than the focal point a lyophobic region, while the focal point remains as a lyophilic region. Liquid affinity treatment for increasing the wettability of the transparent adhesive may be performed on the focal point, depending on the type of the transparent adhesive.

Method for Transferring Transparent Adhesive

Subsequently, transparent adhesive 35 is transferred and applied to focal point having lyophilic surface. As a method for transferring transparent adhesive 35, a transfer pin having a semispherical shape with a tip of 20 to 50 μm is contacted to transparent adhesive on a transferring stage adjusted to have a uniform thickness of 20 to 100 μm. Subsequently, the transparent adhesive is transferred once to the tip of the transfer pin by a surface tension.

After that, the transfer pin is contacted to the focal point of lens 31, and the transparent adhesive transferred to the tip of the transfer pin is re-transferred to the focal point. With the steps described above, transparent adhesive 35 of the predetermined amount is applied to the focal point.

Since transparent adhesive 35 wets a lyophilic region which is the focal point but is shed in another liquid repellant region, transparent adhesive 35 does not exceed the focal point.

Method for Mounting Solar Cell on Lens

Next, as illustrated in FIG. 1, transparent electrode 12 of solar cell 10 is mounted on transparent adhesive 35 applied on the focal point of lens 31 while positioning solar cell 10.

Solar cell 10 is extremely thin, and is 5 to 50 μm in thickness. A compound semiconductor such as GaAs or Ge is used for solar cell 10. Accordingly, solar cell 10 is extremely fragile. In response to the problem, it is necessary to mount solar cell 10 on lens 31 in such a way that solar cell 10 is not damaged. Accordingly, solar cell 10 is lightly suctioned by a planar vacuum tweezer, and is mounted on liquid transparent adhesive 35. The load on mounting is approximately 10 to 50 gf ($9.81 \times 10^{-2}$ to $4.90 \times 10^{-1}$ N).

Solar cell 10 mounted on liquid transparent adhesive 35 is positioned to a lyophilic region (that is, focal point) by being wet with transparent adhesive. As an example, when solar cell 10 is a square having a side of 800 μm, a lyophilic region is set to be a square having a side of 900 μm, and the rest is set to be a liquid repellant region. Consequently, solar cell 10 automatically moves to XY direction due to the balance of surface tension of transparent adhesive 35, and is positioned inside a square having a side of 900 μm in the end.

Solar cells 10 may be mounted one by one by the vacuum tweezers. Alternatively, a plurality of solar cells 10 may be collectively mounted on the arrangement aligned on lens 31, using a metal mask having holes corresponding to focal points. Alternatively, solar cell 10 may be arranged on focal points, which are lyophilic regions, by applying a liquid, in which solar cells 10 are dispersed, to lens 31.

When solar cell 10 is arranged at focal point, transparent adhesive 35 is cured. Room temperature curable two-component resin is used as transparent adhesive 35, for example. When room-temperature curable resin is used at room temperature, the resin starts to be cured approximately 90 minutes later, and is completely cured in 24 hours.

Alternatively, a UV-curable resin may be used as transparent adhesive 35. When the UV-curable resin is used, the resin is irradiated with the UV light after solar cell 10 is positioned to focal point and mounted. In the manner described above, transparent electrode 12 of solar cell 10 is appropriately fixed to focal point of lens 31.

Method for Attaching ACF on Substrate

ACF 36 is attached to the surface of substrate 24. ACF 36 is an anisotropic conductive film, which is composed of an epoxy resin film including conductive particles dispersed therein. ACF 36 is mostly used for mounting drivers for driving liquid crystal displays. In Embodiment, ACF 36 for this purpose may be used.

First, ACF 36 is cut into a shape larger than a region on substrate 24 on which solar cell 10 is provided, for example, a size surrounding the second conductive line. It is necessary for ACF 36 to have a thickness sufficiently greater than a gap between an electrode of solar cell 10 and the conductive line on substrate 24. Accordingly, as ACF 36, an ACF thicker than first conductive line 25a and second conductive line 25b is used. As an example, when the thickness of first conductive line 25a and second conductive line 25b is 35 ACF with a thickness of 40 to 60 µm is used as ACF 36.

Subsequently, ACF 36 that is cut is attached to the arrangement region on substrate 24 by heating and pressuring. The position of ACF 36 is adjusted to the arrangement region of substrate 24, and the entire ACF 36 is pressured for 5 seconds or less from above, using a planar tool heated to 60 to 100° C. Here, ACF 36 is attached to an arrangement region under a condition that does not cure the epoxy resin inside ACF 36 (temporary compression-pressing step).

Method for Temporarily Compression-Bonding Substrate and Lens

Subsequently, lens 31 on which solar cell 10 is attached is mounted on substrate 24 to which ACF 36 is attached. Projection 33 of lens 31 and recess of substrate 24 are fit into each other. With this, substrate 24, solar cell 10, and lens 31 are arranged at proper positions.

When lens 31 does not have projection 33, the mounting position of solar cell 10 and the positions of first conductive line 25a and second conductive line 25b of substrate 24 are checked by a recognition camera in the mounting apparatus. Subsequently, using the location data checked, solar cell 10 is mounted at predetermined positions of first conductive line 25a and second conductive line 25b.

At this point, in order to perform mounting highly accurately, mounting is performed at room temperature and low load. Accordingly, an electrode in solar cell 10 and a conductive line on substrate 24 are not electrically conducted.

Main Method for Compression-Bonding Substrate and Lens

Subsequently, solar cell 10 and substrate 24 are electrically connected, and solar cell 10 and substrate 24 are physically fixed with each other.

First, the temporal compression-bonded components by the temporal compression-bonding step described above are placed, with substrate 24 as the top surface on a metal stage at room temperature where polytetrafluoroethylene or polyimide is attached on the surface in order not to damage the surface of lens 31. A metal pressured plate heated to approximately 180 to 220° C. is pressured for 5 to 20 seconds from above substrate 24, with a load of approximately 50 to 200 gf (0.49 to 1.96N) per each solar cell. The epoxy resin inside ACF 36 is melt and cured by the pressure. At the same time, central electrode 16b in solar cell 10 and first conductive line 25a on the substrate, and second electrode 16a in solar cell 10 and second conductive line 25b on substrate 24 are electrically connected respectively by conductive particles in ACF 36 provided in between. In the manner described above, solar cell 10, first conductive line 25a, and second conductive line 25b are electrically connected, and solar cell 10 and the substrate are physically fixed (main compression-bonding step).

When lens 31 has projection 33, lens 31 is supported over substrate 24 by the height of pillar 33a. With this structure, it is possible to prevent application of excessive load on solar cell 10. Accordingly, it is possible to prevent solar cell 10 from being damaged during the main compression-bonding step.

Method for Sealing Substrate and Lens

Subsequently, sealing resin 22 is provided in a gap between substrate 24 and lens 31 (see FIG. 1 and FIG. 2).

When solar cell 10 is bonded to substrate 24 only with ACF 36, stress is concentrated on the bonded part by ACF 36, due to the difference between the linear expansion coefficient of lens 31 and the linear expansion coefficient of substrate 24. The concentration of stress due to the difference in the linear expansion coefficients can be reduced by fitting tapered part 33b of lens 31 and tapered hole 28 of substrate 24. The concentration of stress can be reduced further by filling the gap between substrate 24 and lens 31 with sealing resin 22. By filling the gap with sealing resin 22, fixed substrate 24 and lens 31 are integrated through solar cell 10 and/or along with the fitting of tapered part 33b and tapered hole 28.

Filling of the gap between substrate 24 and lens 31 with sealing resin 22 is typically accomplished by placing substrate 24 on a metal stage heated to 50 to 80° C. allowing liquid sealing resin 22 to flow into the gap using capillary phenomenon.

Alternatively, sealing resin 22 is applied on substrate 24 before the temporal compression-bonding step, the gap is filled with sealing resin 22 by pressuring in the heating and pressuring step during the main compression-bonding step, and sealing resin 22 is cured by the heat during the main compression-bonding step. With this method, solar cell 10, first conductive line 25a, and second conductive line 25b can be electrically connected while simultaneously sealing the gap using sealing resin 22.

Sealing resin 22 is composed of an epoxy or silicone resin material. Examples of sealing resin 22 include resin materials used as a main agent and a curing agent for two-component adhesives, UV-curable resins, and thermosetting resins.

When the gap between substrate 24 and lens 31 is filled with sealing resin 22, sealing resin 22 is naturally cured at a temperature of 80° C. or lower (for example, at room temperature (20±15° C.)). Alternatively, sealing resin 22 is cured by irradiation with UV light.

The solar cell battery according to the embodiment is placed under sunlight. Lens 31 is irradiated with sunlight along with the direction of arrows X. Sunlight entered lens 31 is concentrated on, for example, transparent electrode 12, toward the cell laminate by lens 31. The light passed through transparent electrode 12 passes though top cell layer T, middle cell layer M, and bottom cell layer B in the cell laminate. Subsequently, among sunlight, the light according to an absorption wavelength of each cell layer is converted to an electromotive force in each cell layer. For example, the conversion efficiency in solar cell 10 is approximately 30 to 50%.

Under sunlight, lens 31 is heated by infrared light contained in sunlight. In the solar cell battery according to the embodiment, the heat at lens 31 is rapidly transferred from transparent electrode 12 to substrate 24 through third electrode 9b and second electrode 16a. The heat is then dissipated from substrate 24 to outside.

In addition, the heat at lens 31 generates stress in the solar cell battery. The generated stress is dispersed by sealing resin 22 in the gap between substrate 24 and lens 31. In addition, the stress is also dispersed by projection 33 of lens 31. Accordingly, it is possible to prevent a cell laminate and solar cell 10 from being broken due to the concentration of stress on transparent adhesive 35 and ACF 36.

Since the electrode placed on the incident surface of sunlight is transparent, the solar cell battery according to the embodiment can gather sunlight on the cell laminate with its high light transmissivity.

In the solar cell battery according to Embodiment, the cell laminate of solar cell 10 is a three-layered structure including top cell layer T, middle cell layer M, and bottom cell layer B. Accordingly, the light in various wavelength ranges in sunlight can be effectively used for the photovoltaic power generation. Accordingly, a highly efficient solar cell battery can be achieved.

In addition, in the solar cell battery according to the embodiment, lens 31 is closely attached to solar cell 10. Accordingly, the thickness of the solar cell battery, which is a distance from the bottom surface of substrate 24 to the top of lens 31 is approximately 20 mm. Compared to a conventional solar cell battery in which lens 31 for concentrating light onto the cell laminate is placed apart from the solar cell 10, the solar cell battery according to the embodiment may be configured with a thickness of approximately 10% of the conventional solar cell battery.

In the solar cell battery according to the embodiment, lens 31 is closely attached to solar cell 10, solar cell 10 includes second electrode 16a connecting the incident surface of sunlight and the opposite side, and substrate 24 includes metal plate 27. Accordingly, the heat at lens 31 on the incident surface side of sunlight is dissipated to substrate 24 on a side opposite to the incident surface. Moreover, metal plate 27 on substrate 24 has a surface area significantly greater than that of the electrode. Accordingly, the heat at lens 31 dissipated to substrate 24 is dissipated to the outside from metal plate 27. Accordingly, compared to a conventional solar cell battery in which the heat at the lens is dissipated from the side of the lens, the temperature of lens 31 can be lowered. Therefore, a transparent resin having low heat tolerance can be used as a material for lens 31.

Accordingly, compared to a case where a glass lens is used, the cost for lens 31 is reduced further. Furthermore, by using a resin lens for lens 31, the weight of the solar cell battery can be reduced compared to a case where a glass lens is used, further improving the efficiency with which the solar cell battery is placed under sunlight.

In the solar cell battery according to the embodiment, in solar cell 10, an electrode having the potential of top cell layer T and an electrode having the potential of bottom cell layer B are provided on a surface opposite to the incident surface of sunlight. Accordingly, by using ACF 36, solar cell 10 is mounted on substrate 24 by a single step, that is, a thermal compression bonding step. Accordingly, the lead time for producing the solar cell battery is reduced.

Furthermore, the solar cell battery according to the embodiment may set the gap between substrate 24 and lens 31 uniform by forming projection 33 having tapered part 33b on lens 31. This structure prevents solar cell 10 from receiving excessive load. In addition, arranging tapered part 33b and tapered hole 28 according to the positions for mounting lens 31, solar cell 10, and substrate 24 facilitates positioning lens 31 and substrate 24. Furthermore, the stress due to heat at lens 31 can be dispersed along the planar direction of substrate 24.

As described above, according to the embodiment, a lighter, more compact solar cell battery having high heat tolerance cycle, high tolerance to humidity, and highly resistance to impact can be manufactured easily. In addition, no interconnection is required for the lens. Furthermore, since the electrode on the sunlight-receiving section side runs along the lateral side of solar cell 10 and is electrically connected to second conductive line 25b on heat dissipative substrate 24, the conductive path can be used as a heat conductive path. Accordingly, high heat dissipation property of the solar cell battery can be achieved. Furthermore, by providing projection 33 on lens 31, a damage-resistant mounting method can be provided for a fragile solar cell battery.

The present application claims the benefit of foreign priority of an earlier Japanese application filed by the same Applicant, that is, Japanese Patent Application No. 2011-273742 filed on Dec. 14, 2011, the contents of which are incorporated herein by reference.

INDUSTRIAL APPLICABILITY

The solar cell battery according to the present invention may be used for a terrestrial concentrator solar cell battery, as well as for the conventional space concentrator solar cell battery. In addition, the conversion efficiency of sunlight is dramatically increased compared to a conventional silicon solar cell battery. Therefore, the solar cell battery is suitable for a large scale power generation system in areas with high sunlight.

REFERENCE SIGNS LIST

1 GaAs substrate
2a Second contact layer
2b First contact layer
4 Sacrificial layer
4a Sacrificial layer recess
9a First electrode
9b Third electrode
10, 120, 220 Solar cell
12 Transparent electrode
16a Second electrode
16b Central electrode
16c Au/Ti laminate film
16d Ti film
17 Second insulating layer
17a, 17b Window of second insulating layer
18 Resist
19a, 19b Tunnel layer
20 Grid layer
21 Buffer layer
22 Sealing resin
24 Substrate
25a First conductive line
25b Second conductive line
26 First insulating layer
27 Metal plate (base)
28 Tapered hole
29 Working substrate
31 Lens
32 Focal point
33 Projection
33a Pillar
33b Tapered part
35 Transparent adhesive
36 ACF (anisotropic conductive film)
37 Base member
50 Cell laminate
100, 200 Solar cell battery
110, 210 Optical component
113 Recess
124A First connecting part
124B Second connecting part
140 Back sheet
150 Circuit board 153 Insulator
154 Conductor
154A, 154B Electrode parts
155 Adhesive layer
230 Primary mirror
231, 234 Metal films
237 Gap
239 Opening
300 Solid light-transparent optical panel
400C Concentrator solar collecting unit
420 Socket connector
A Line surrounding solar cell 10 in solar cell battery in FIG. 1
B Bottom cell layer
M Middle cell layer
T Top cell layer
X Arrows representing an irradiation direction of sunlight

The invention claimed is:

1. A solar cell battery comprising:
    a substrate including a tabular base having heat dissipation property, a first conductive line and a second conductive line, the first conductive line and the second conductive line provided on the base;
    a multijunction solar cell including a first electrode electrically connected to the first conductive line; a bottom cell layer provided on the first electrode; a top cell layer provided on the bottom cell layer; a transparent electrode provided on the top cell layer; an insulating layer provided on a side surface of a cell laminate including the bottom cell layer and the top cell layer; and a second electrode provided on a side surface of the cell laminate through the insulating layer and is electrically connected to the transparent electrode and the second conductive line; and
    a lens provided in close contact with the transparent electrode, the lens configured to concentrate incident light toward the transparent electrode,
    wherein the lens further includes a pillar projecting from a surface of the lens opposite to a light incident surface of the lens, and a tapered part provided at a tip of the pillar,
    wherein the substrate further includes a tapered hole into which the tapered part is fitted,
    wherein the solar cell battery further comprises a central electrode on a side of a lower surface of the first electrode, and
    wherein a lower surface of the second electrode and a lower surface of the central electrode are provided in the same plane.

2. The solar cell battery according to claim 1, further comprising an anisotropic conductive film provided between the first electrode and the first conductive line, and between the second electrode and the second conductive line.

3. The solar cell battery according to claim 1, wherein the multijunction solar cell includes a plurality of multijunction solar cells provided on a single board of the substrate, and
    the lens is a compound eye lens configured to concentrate the incident light toward each transparent electrode, the each transparent electrode being in close contact with the lens.

4. The solar cell battery according to claim 1, wherein a lower surface of the second electrode is positioned below a lower surface of the first electrode.

5. A method for manufacturing a solar cell battery comprising:
    providing a lens having a focal point on a surface opposite to a light incident surface, a pillar projecting from a surface of the lens opposite to a light incident surface of the lens, and a tapered part provided at a tip of the pillar;
    providing a multijunction solar cell including: a first electrode; a bottom cell layer provided on the first electrode; a top cell layer provided on the bottom cell layer; a transparent electrode provided on the top cell layer; an insulating layer provided on a side surface of a cell laminate including the bottom cell layer and the top cell layer; a second electrode electrically connected to the transparent electrode and provided on a side surface of the cell laminate through the insulating layer; and a central electrode provided on a side of a lower surface of the first electrode;
    providing a substrate including a tabular base having heat dissipation property, a first conductive line and a second conductive line, the first conductive line and the second conductive line provided on the base, the substrate including a tapered hole into which the tapered part is fitted, at a position on which the multijunction solar cell is to be provided on the substrate;
    bonding the lens and the multijunction solar cell such that the lens concentrates the incident light toward the transparent electrode;
    determining a bonding position for the multijunction solar cell with respect to the substrate by fitting the tapered part into the tapered hole; and
    bonding the multijunction solar cell and the substrate such that the first electrode of the multijunction solar cell bonded to the lens is electrically connected to the first conductive line and the second electrode is electrically connected to the second conductive line,
    wherein a lower surface of the second electrode and a lower surface of the central electrode are provided in the same plane.

6. The method for manufacturing the solar cell battery according to claim 5, wherein an anisotropic conductive film is provided between the multijunction solar cell and the substrate.

7. The method for manufacturing the solar cell battery according to claim 5, wherein the lens is a compound eye lens having a plurality of focal points on a surface opposite to a light incident surface,
    the substrate has the first conductive line and the second conductive line at positions corresponding to each of the focal points, and
    each of a plurality of the multijunction solar cells is bonded to each of the focal points of the compound eye lens, respectively and to the substrate.

* * * * *